US012645138B2

(12) United States Patent
Hsu et al.

(10) Patent No.: US 12,645,138 B2
(45) Date of Patent: Jun. 2, 2026

(54) MULTI-LAYER PELLICLE MEMBRANE

(71) Applicant: Taiwan Semiconductor Manufacturing Company, Ltd., Hsinchu (TW)

(72) Inventors: Pei-Cheng Hsu, Taipei (TW); Ta-Cheng Lien, Cyonglin Township (TW); Hsin-Chang Lee, Zhubei City (TW); Tsai-Sheng Gau, Hsinchu City (TW); Chin-Hsiang Lin, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 493 days.

(21) Appl. No.: 17/318,487

(22) Filed: May 12, 2021

(65) Prior Publication Data

US 2022/0365420 A1     Nov. 17, 2022

(51) Int. Cl.
G03F 1/62          (2012.01)

(52) U.S. Cl.
CPC ...................................... G03F 1/62 (2013.01)

(58) Field of Classification Search
CPC .......................................................... G03F 1/62
See application file for complete search history.

(56) References Cited

U.S. PATENT DOCUMENTS

| | | | |
|---|---|---|---|
| 9,958,770 B2 | 5/2018 | Ahn et al. | |
| 11,092,886 B2 | 8/2021 | Timmermans et al. | |
| 11,237,474 B2 | 2/2022 | Nishimura | |
| 2018/0149966 A1* | 5/2018 | Shin | G03F 1/62 |
| 2018/0329291 A1* | 11/2018 | Timmermans | G03F 1/64 |
| 2019/0129300 A1* | 5/2019 | Ono | H01L 21/0274 |
| 2019/0302608 A1 | 10/2019 | Hamada | |
| 2020/0174361 A1 | 6/2020 | Yanase | |
| 2020/0201169 A1 | 6/2020 | Mariano et al. | |
| 2020/0272047 A1* | 8/2020 | Chatterjee | B01J 37/347 |
| 2020/0355995 A1 | 11/2020 | Kim et al. | |
| 2021/0132490 A1* | 5/2021 | Lin | G03F 1/62 |
| 2021/0191255 A1* | 6/2021 | Timmermans | G03F 1/62 |
| 2022/0260902 A1* | 8/2022 | Takada | G03F 1/64 |

FOREIGN PATENT DOCUMENTS

| | | | | |
|---|---|---|---|---|
| CN | 106233202 A | 12/2016 | | |
| CN | 108878259 A | 11/2018 | | |
| CN | 111352295 A | 6/2020 | | |
| JP | 2002049145 A | * 2/2002 | | G03F 1/62 |
| TW | 202043910 A | 12/2020 | | |
| WO | WO-2014142125 A1 * | 9/2014 | | B01D 71/021 |

OTHER PUBLICATIONS

English machine translation of WO-2014142125-A1 (Sep. 2014) (Year: 2014).*

English machine translation of JP-2002049145-A (Feb. 2002) (Year: 2002).*

* cited by examiner

*Primary Examiner* — Jonathan Johnson
*Assistant Examiner* — Jayson D Cosgrove
(74) *Attorney, Agent, or Firm* — Lippes Mathias LLP

(57)          ABSTRACT

A pellicle assembly includes a pellicle membrane and a conformal coating on an outer surface of the pellicle membrane. The pellicle membrane can be formed with multiple layers and has a combination of high transmittance, low deflection, and small pore size. The conformal coating is intended to protect the pellicle membrane from damage that can occur due to heat and hydrogen plasma created during EUV exposure.

20 Claims, 22 Drawing Sheets

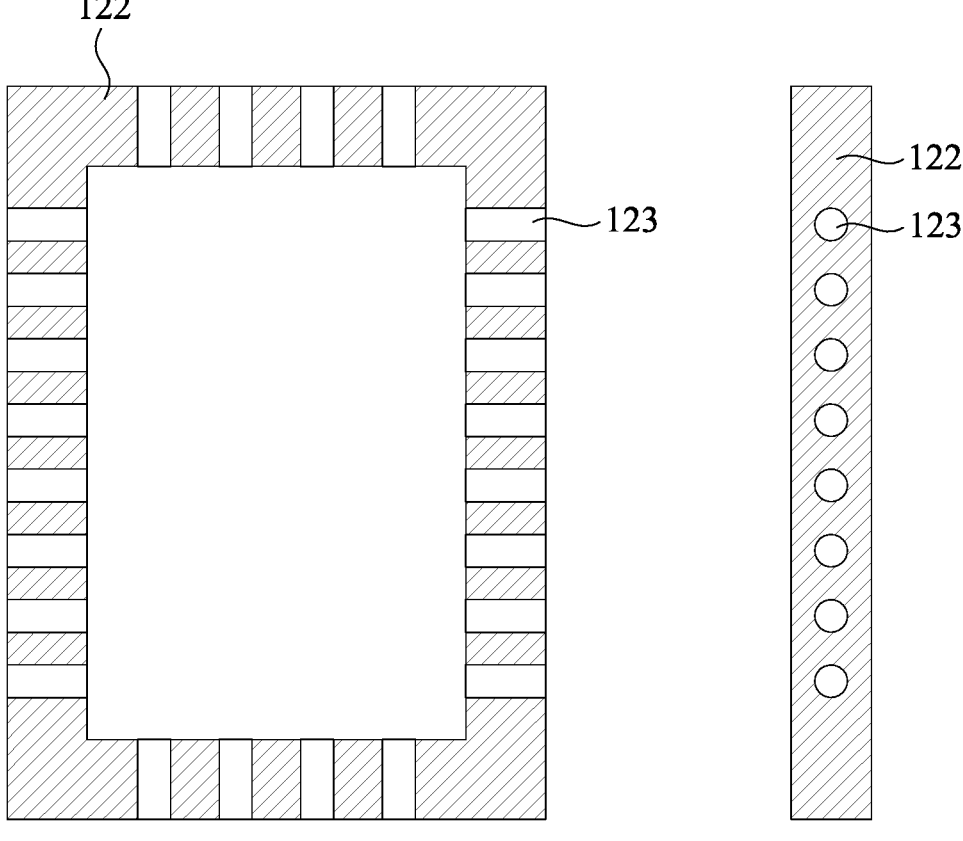
Fig. 11A                          Fig. 11B
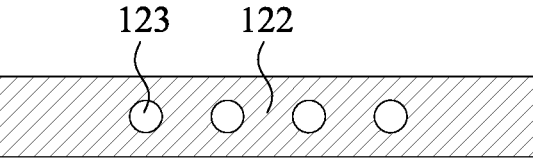
Fig. 11C

| |
|---|
| Form a nanotube suspension |

— 200

| |
|---|
| Form an initial nanotube membrane from the nanotube suspension |

— 210

| |
|---|
| Process the initial nanotube membrane to obtain the nanotube membrane layer |

— 220

| Produce nanotube fibers | ~300 |
| Form an initial nanotube membrane from the nanotube fibers | ~310 |
| Process the initial nanotube membrane to obtain the nanotube membrane layer | ~320 |

250

254

240
342
252

260

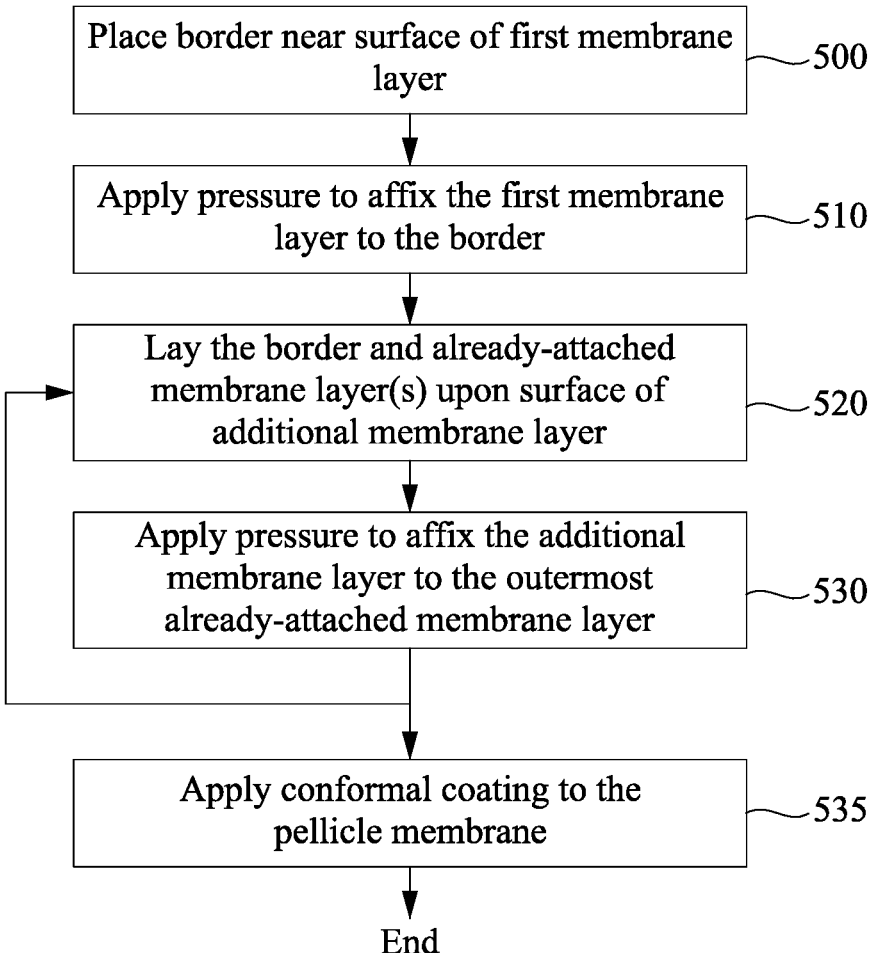

Place border near surface of first membrane layer ⟋⟍500

Apply pressure to affix the first membrane layer to the border ⟋⟍510

Lay the border and already-attached membrane layer(s) upon surface of additional membrane layer ⟋⟍520

Apply pressure to affix the additional membrane layer to the outermost already-attached membrane layer ⟋⟍530

Apply conformal coating to the pellicle membrane ⟋⟍535

End

Fig. 18

MULTI-LAYER PELLICLE MEMBRANE

BACKGROUND

A photolithographic patterning process uses a reticle (i.e. photomask) that includes a desired mask pattern. The reticle may be a reflective mask or a transmission mask. In the process, ultraviolet light is reflected off the surface of the reticle (for a reflective mask) or transmitted through the reticle (for a transmission mask) to transfer the pattern to a photoresist on a semiconductor wafer. The exposed portion of the photoresist is photochemically modified. After the exposure, the resist is developed to define openings in the resist, and one or more semiconductor processing steps (e.g. etching, epitaxial layer deposition, metallization, et cetera) are performed which operate on those areas of the wafer surface exposed by the openings in the resist. After this semiconductor processing, the resist is removed by a suitable resist stripper or the like.

The minimum feature size of the pattern is limited by the light wavelength. Deep ultraviolet (UV) lithography, for example using a wavelength of 193 nm or 248 nm in some standard deep UV platforms, typically employs transmission masks and provides a smaller minimum feature size than lithography at longer wavelengths. Extreme ultraviolet (EUV) light, which spans wavelengths from 124 nanometers (nm) down to 10 nm, is currently being used to provide even smaller minimum feature size. At shorter wavelengths, particle contaminants on the reticle can cause defects in the transferred pattern. Thus, a pellicle assembly (or simply pellicle) is used to protect the reticle from such particles. The pellicle assembly includes a pellicle membrane which is attached to a mounting frame. The mounting frame supports the pellicle membrane over the reticle. In this manner, any contaminating particles which land on the pellicle membrane are kept out of the focal plane of the reticle, thus reducing or preventing defects in the transferred pattern caused by the contaminating particles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11A-11C are different views of a mounting frame, in accordance with some embodiments. FIG. 11A is a plan cross-sectional view, FIG. 11B is a first side view, and FIG. 11C is a front side view.

FIG. 13A is a first diagram, FIG. 13B is a second diagram, FIG. 13C is a third diagram, and FIG. 13D is a fourth diagram.

FIG. 15A is a first diagram, FIG. 15B is a second diagram, and FIG. 15C is a third diagram.

FIG. 17A is a first diagram, and FIG. 17B is a second diagram.

FIG. 18 is a flow chart illustrating a method for preparing a multi-layer structure for a pellicle membrane, in accordance with some embodiments.

FIG. 19A is a first diagram, FIG. 19B is a second diagram, and FIG. 19C is a third diagram.

FIG. 21A is a first diagram, FIG. 21B is a second diagram, and FIG. 21C is a third diagram.

FIG. 22A is a first diagram, FIG. 22B is a second diagram, FIG. 22C is a third diagram, and FIG. 22D is a fourth diagram.

DETAILED DESCRIPTION

Figure 1:
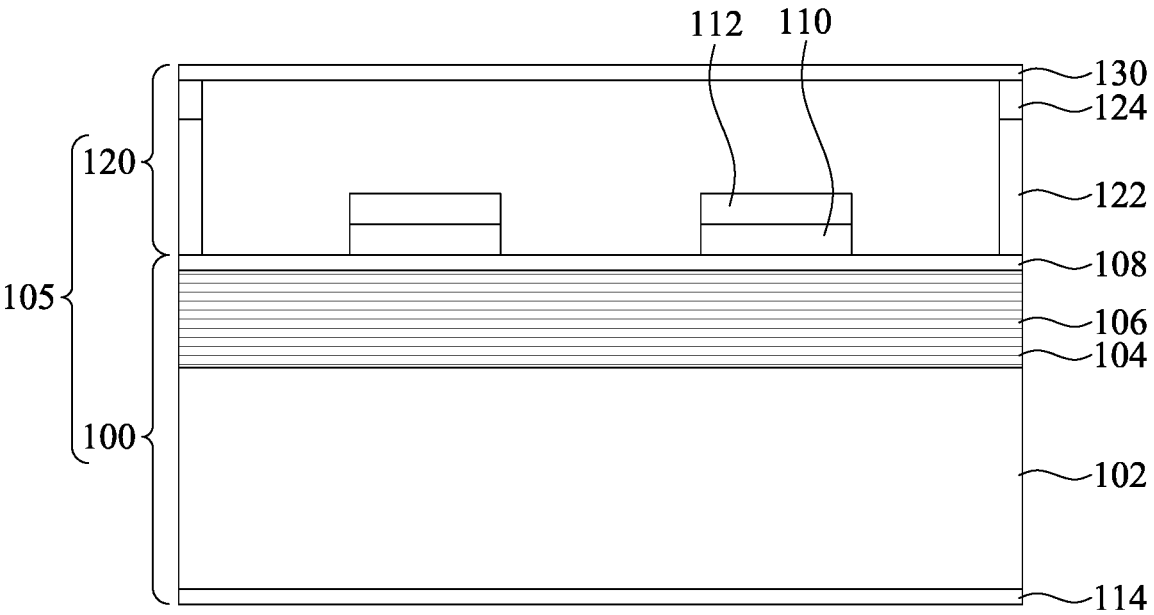
FIG. 1 is a cross-sectional view of an example reticle and pellicle assembly, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure may refer to temperatures for certain method steps. It is noted that these references are usually to the temperature at which the heat source is set, and do not specifically refer to the temperature which must be attained by a particular material being exposed to the heat.

FIG. 1 illustrates a cross-sectional view of an example reticle assembly 105 useful in lithography, according to some embodiments. The reticle assembly 105 includes a reticle 100 and a pellicle assembly 120. The illustrative reticle 100 (also referred to in the art as a mask, photomask, or similar phraseology) is a reflective mask of a type commonly used in EUV lithography, and includes a substrate 102, alternating reflective layers 104 and spacing layers 106, a capping layer 108, an EUV absorbing layer 110 that is patterned to define a mask pattern, an anti-reflective coating (ARC) 112, and a conductive backside layer 114. The illustrative reticle 100 is merely a nonlimiting example. More generally, pellicles as disclosed herein can be used with substantially any type of reflective or transmission reticle. As another example (not shown), the reticle may be a transmission reticle, in which case the substrate is transmissive for light at the wavelength at which the lithography is performed. In general, the reflective or transmissive reticle includes a substrate (e.g. substrate 102) and a mask pattern (e.g. absorbing layer 110) disposed on the substrate. The pellicle assembly 120 includes a mounting frame 122, an adhesive layer 124, and a pellicle membrane 130. In some non-limiting illustrative embodiments, the reticle and pellicle assembly are intended for use with EUV light wavelengths, for example from 124 nm to 10 nm, including about 13.5 nm.

In embodiments, the substrate 102 is made from a low thermal expansion material (LTEM), such as quartz or titania silicate glasses available from Corning under the trademark ULE. This reduces or prevents warping of the reticle due to absorption of energy and consequent heating. The reflective layers 104 and the spacing layers 106 cooperate to form a Bragg reflector for reflecting EUV light. In some embodiments, the reflective layers may comprise molybdenum (Mo). In some embodiments, the spacing layers may comprise silicon (Si). The capping layer 108 is used to protect the reflector formed from the reflective layers and the spacing layers, for example from oxidation. In some embodiments, the capping layer comprises ruthenium (Ru). The EUV absorbing layer 110 absorbs EUV wavelengths, and is patterned with the desired pattern. In some embodiments, the EUV absorbing layer comprises tantalum boron nitride. The anti-reflective coating (ARC) 112 further reduces reflection from the EUV absorbing layer. In some embodiments, the anti-reflective coating comprises oxidized tantalum boron nitride. The conductive backside layer 114 permits mounting of the illustrative reticle on an electrostatic chuck and temperature regulation of the mounted substrate 102. In some embodiments, the conductive backside layer comprises chrome nitride.

The mounting frame 122 supports the pellicle membrane at a height sufficient to take the pellicle membrane 130 outside the focal plane of the lithography, e.g. several millimeters (mm) over the reticle in some nonlimiting illustrative embodiments. The mounting frame itself can be made from suitable materials such as anodized aluminum, stainless steel, plastic, silicon (Si), titanium, silicon dioxide, aluminum oxide ($Al_2O_3$), or titanium dioxide ($TiO_2$). Vent holes may be present in the mounting frame for equalizing pressure on both sides of the pellicle membrane.

The adhesive layer 124 is used to secure the pellicle membrane to the mounting frame. Suitable adhesives may include a silicon, acrylic, epoxy, thermoplastic elastomer rubber, acrylic polymer or copolymer, or combinations thereof. In some embodiments, the adhesive can have a crystalline and/or amorphous structure. In some embodiments, the adhesive can have a glass transition temperature (Tg) that is above a maximum operating temperature of the photolithography system, to prevent the adhesive from exceeding the Tg during operation of the system.

The pellicle membrane 130 is usually stretched over the mounting frame to obtain a uniform and flat surface. However, sagging of the pellicle membrane can occur, causing the membrane to deflect significantly from the desired flat and uniform orientation. This deflection can affect the light that is being reflected from the reticle and the resulting transferred pattern.

Complicated fabrication processes are used to make pellicle membranes from conventional pellicle materials such as porous silicon (pSi), SiN, SiC, MoSi, or $MoSi_xN_y$. Membranes made from these materials also break easily when exposed to large pressure differentials. These materials also need a coated metal layer to be applied thereon, to increase thermal conductivity. Membranes made exclusively from carbon nanotubes can be damaged by hydrogen during EUV exposure. Carbon nanotube membranes are also typically non-uniform, and as a result also have non-uniform transmittance and reflectivity. Low-density carbon nanotube membranes usually have very large openings/pores, with sizes large enough to potentially permit particle contaminants to penetrate the mask, land on the reticle, and induce critical dimension (CD) errors. Low-density carbon nanotube membranes may potentially be sources of particle contaminants too, due to single bundle vibration of the nanotubes in a vacuum system during EUV exposure.

In addition, reticles (and their protective pellicle assembly) are maintained in reticle pods for safety and protection during lithographic patterning and other processes. Current EUV lithography systems typically use a dual-pod configuration consisting of an inner metal pod under vacuum and an outer pod with access to the ambient environment. The inner pod is only opened when the pod is inside the tool. Pressure differences, gravity, and other external forces can cause the pellicle membrane to deflect or sag. If the pellicle membrane sags far enough to contact the inner surface of the inner metal pod in which the reticle is kept, contamination of the pellicle membrane can occur, or the pellicle membrane itself might break.

The present disclosure thus relates to pellicle membranes and methods for producing pellicle membranes that are intended to reduce deflection of the pellicle membrane while maintaining high transmittance of EUV light and the particle-protecting ability of the pellicle membrane. In some embodiments, the pellicle membrane is a single-layer structure, and in other embodiments the pellicle membrane is a multi-layer structure. In some embodiments, the layers of the multi-layer structure can be made of the same materials, and in other embodiments the layers of the multi-layer structure can be made of different materials selected for particular purposes and arranged in order as desired. For example, in some embodiments, the pellicle membrane may comprise one or more nanotube membrane layers and one or more graphene membrane layers. The pellicle membrane can be attached to a border or to a suitably shaped mounting frame. A conformal coating is then applied to the outer surface of the pellicle membrane (which can be a single layer or a multi-layer structure). The coated pellicle membrane/border can then be affixed to a mounting frame (if needed) to form a pellicle assembly which can be mounted onto a reticle. A combination of several low-density membrane layers can be used to obtain a pellicle membrane that has a combination of high transmittance, small pore size and a stiffness which minimizes any potential deflection. The pellicle membranes may be appropriate for use with EUV light sources, as well as deep ultraviolet (DUV) light sources or other types of photolithographic light sources.

Figure 2:
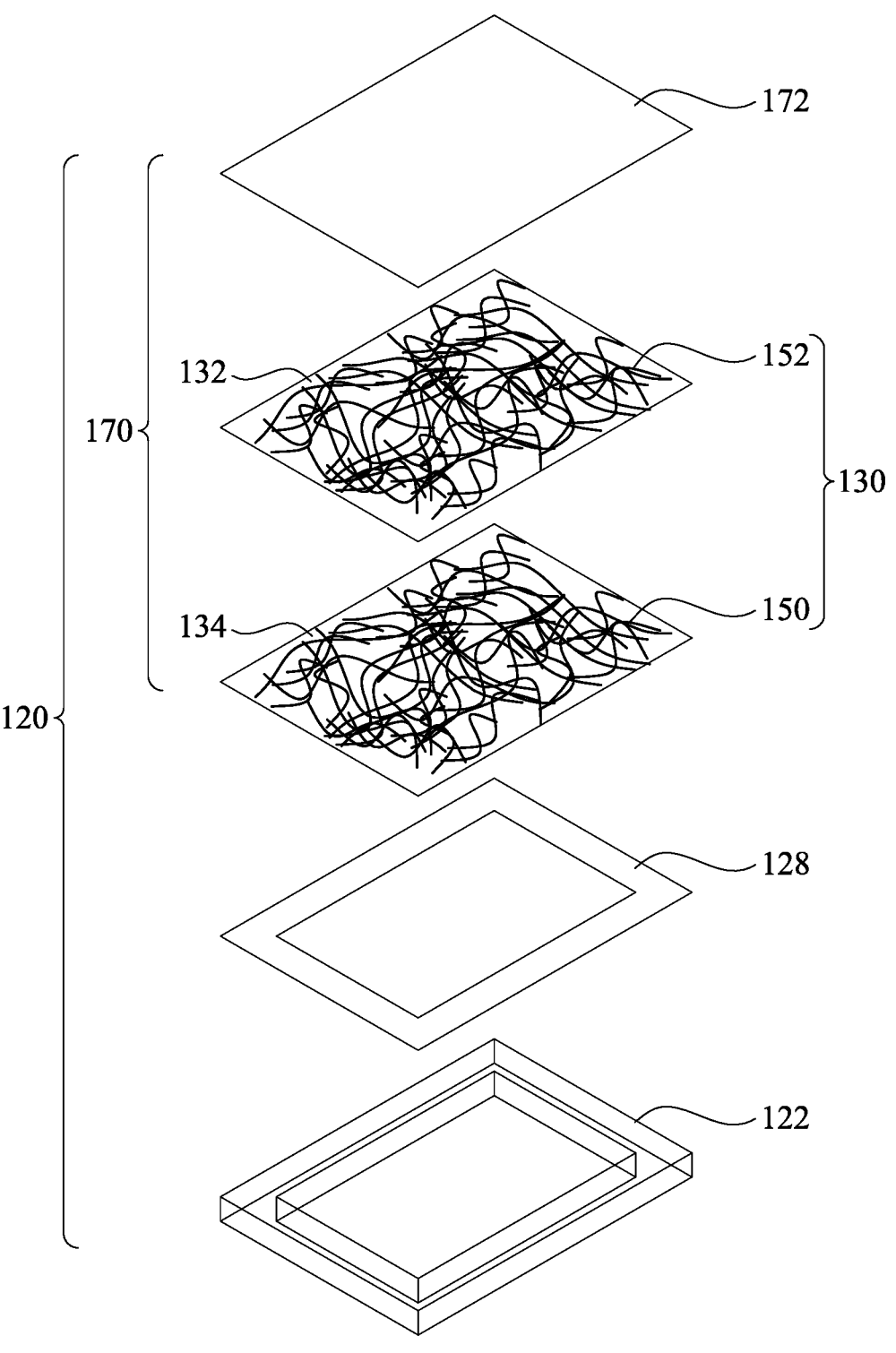
FIG. 2 is an exploded view of a first embodiment of a pellicle membrane, pellicle membrane assembly, and pellicle assembly in accordance with some embodiments.

FIG. 2 is an exploded view of a first embodiment of a pellicle membrane 130, pellicle membrane assembly 170, and pellicle assembly 120 according to the present disclosure. In this first embodiment, the pellicle membrane 130 is a multi-layer structure formed from a first nanotube membrane layer 150 and a second nanotube membrane layer 152. As illustrated here, the first nanotube membrane layer 150 and the second nanotube membrane layer 152 are formed from randomly oriented nanotubes, and the two layers contact each other. In some embodiments, each nanotube membrane layer has a thickness of about 10 nm to about 100 nm.

Here, the second nanotube membrane layer is also considered the outer surface 132 of the pellicle membrane, to which a conformal coating is applied. The conformal coating may be considered to form the outermost layer 172 of the pellicle membrane. In some embodiments, the outermost layer has a thickness of about 1 nanometer (nm) to about 10 nm. The first nanotube membrane layer is also considered the inner surface 134 of the pellicle membrane, and is attached to a border 128. The border runs along the perimeter of the pellicle membrane. The border is also attached to a mounting frame 122.

The combination of the outermost layer/conformal coating 172 and the pellicle membrane 130 together is referred to as a pellicle membrane assembly 170 herein. The combination of the pellicle membrane assembly 170, border 128, and mounting frame 122 is referred to herein as a pellicle assembly 120.

Figure 3:
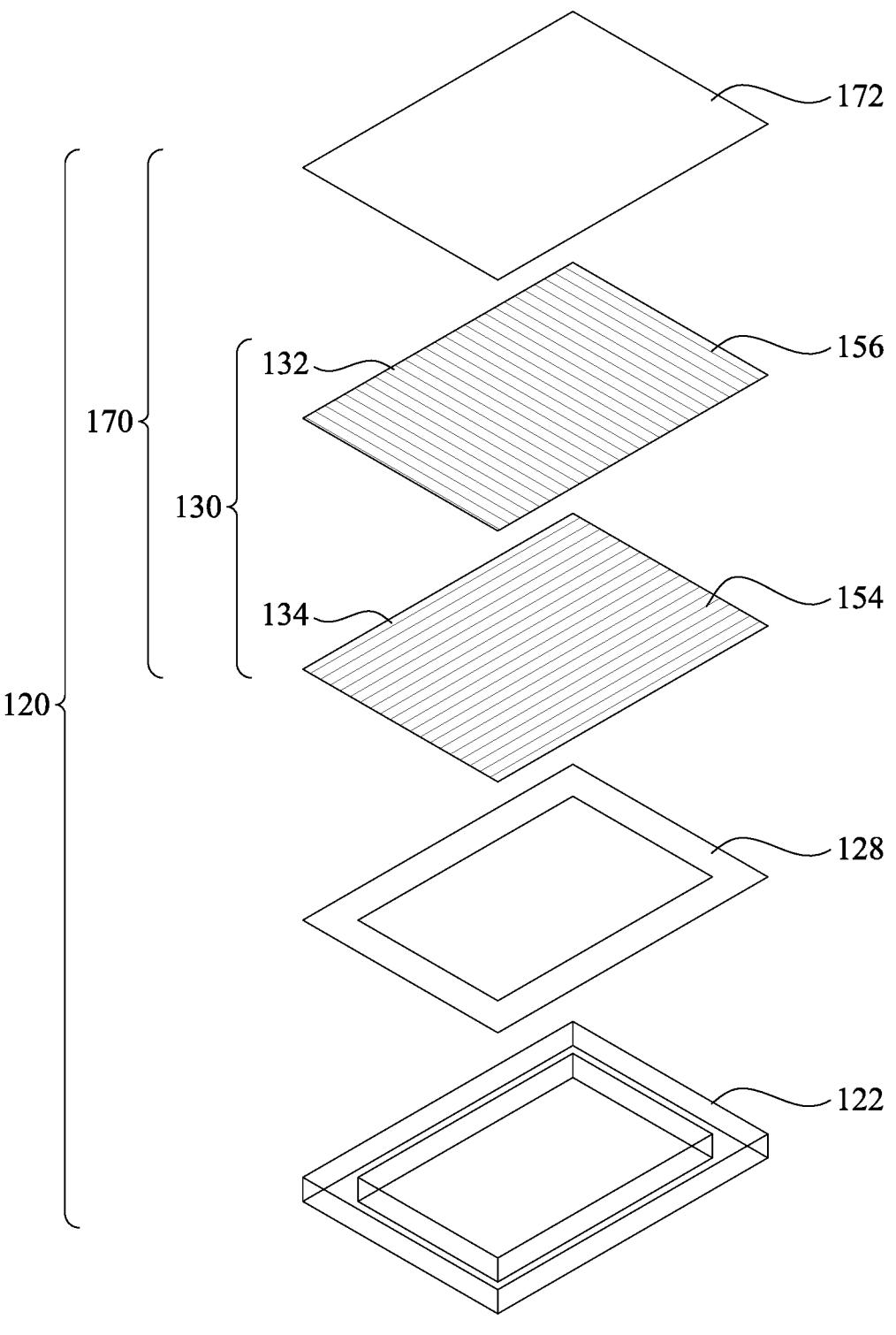
FIG. 3 is an exploded view of a second embodiment of a pellicle membrane, pellicle membrane assembly, and pellicle assembly in accordance with some embodiments.

FIG. 3 is an exploded view of a second embodiment of a pellicle membrane 130, pellicle membrane assembly 170, and pellicle assembly 120 according to the present disclosure. In contrast to FIG. 2, the first nanotube membrane layer 154 and the second nanotube membrane layer 156 are formed from directionally oriented nanotubes. In some embodiments, the directionally oriented nanotube membrane layers are aligned at an angle relative to each other. Here, the two nanotube membrane layers 154, 156 are aligned at 90° relative to each other.

Figure 4:
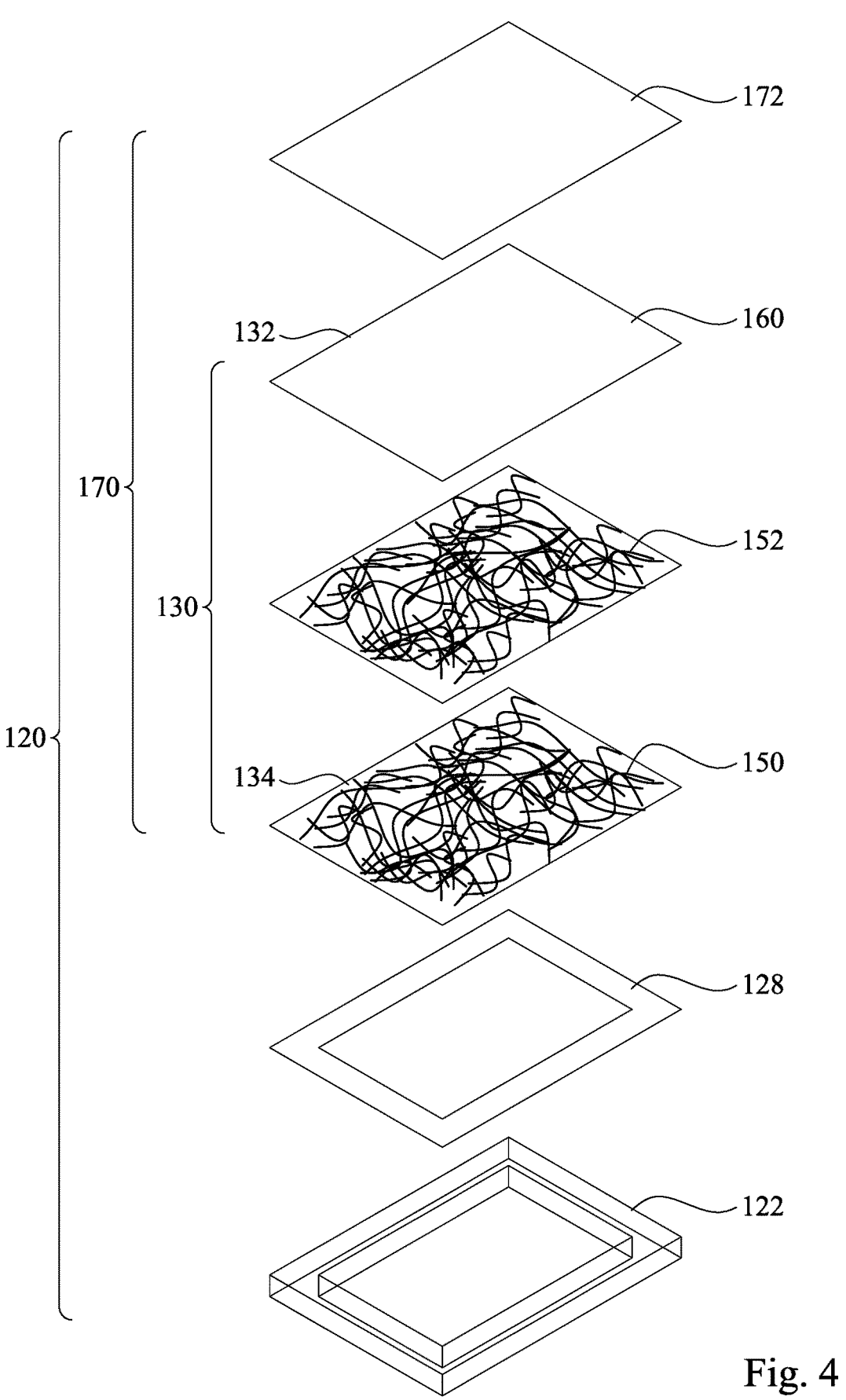
FIG. 4 is an exploded view of a third embodiment of a pellicle membrane, pellicle membrane assembly, and pellicle assembly in accordance with some embodiments.

FIG. 4 is an exploded view of a third embodiment of a pellicle membrane 130, pellicle membrane assembly 170, and pellicle assembly 120 according to the present disclosure. Here, the pellicle membrane is a multi-layer structure formed from a graphene membrane layer 160, a first nanotube membrane layer 150, and a second nanotube membrane layer 152. The graphene membrane layer is also considered the outer surface 132 of the pellicle membrane. The graphene membrane layer may be, in some embodiments, a porous film or a continuous film without pores. The first nanotube membrane layer is also considered the inner surface 134 of the pellicle membrane, and is attached to the border 128. The first nanotube membrane layer 150 and the second nanotube membrane layer 152 are formed from randomly oriented nanotubes. In some embodiments, the graphene membrane layer 160, the first nanotube membrane layer 150, and the second nanotube membrane layer 152 directly contact each other.

Figure 5:
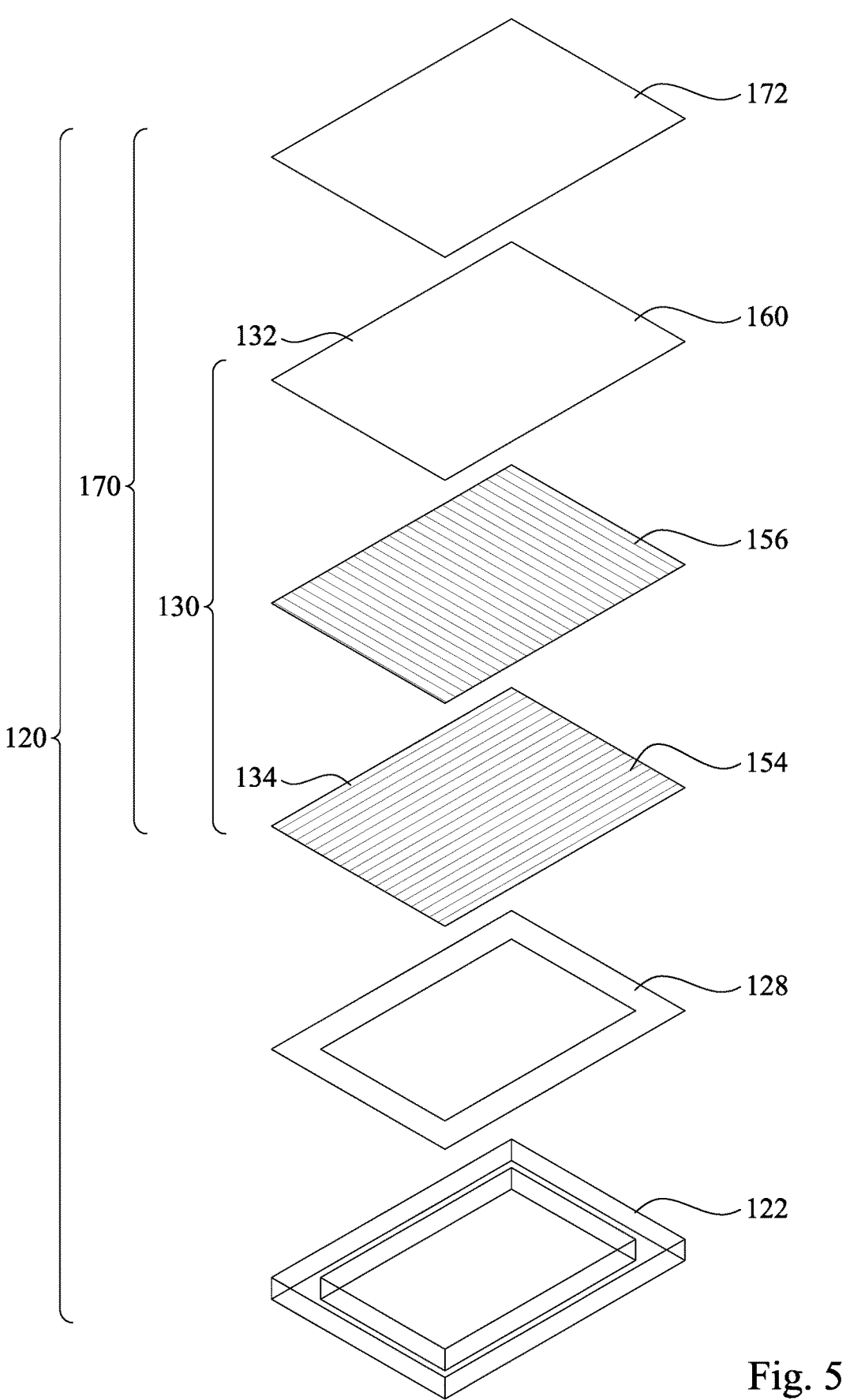
FIG. 5 is an exploded view of a fourth embodiment of a pellicle membrane, pellicle membrane assembly, and pellicle assembly in accordance with some embodiments.

FIG. 5 is an exploded view of a fourth embodiment of a pellicle membrane 130, pellicle membrane assembly 170, and pellicle assembly 120 according to the present disclosure. The pellicle membrane is similar to that of FIG. 4, except the first nanotube membrane layer 154 and the second nanotube membrane layer 156 are formed from directionally oriented nanotubes, as in the embodiment of FIG. 3.

Figure 6:
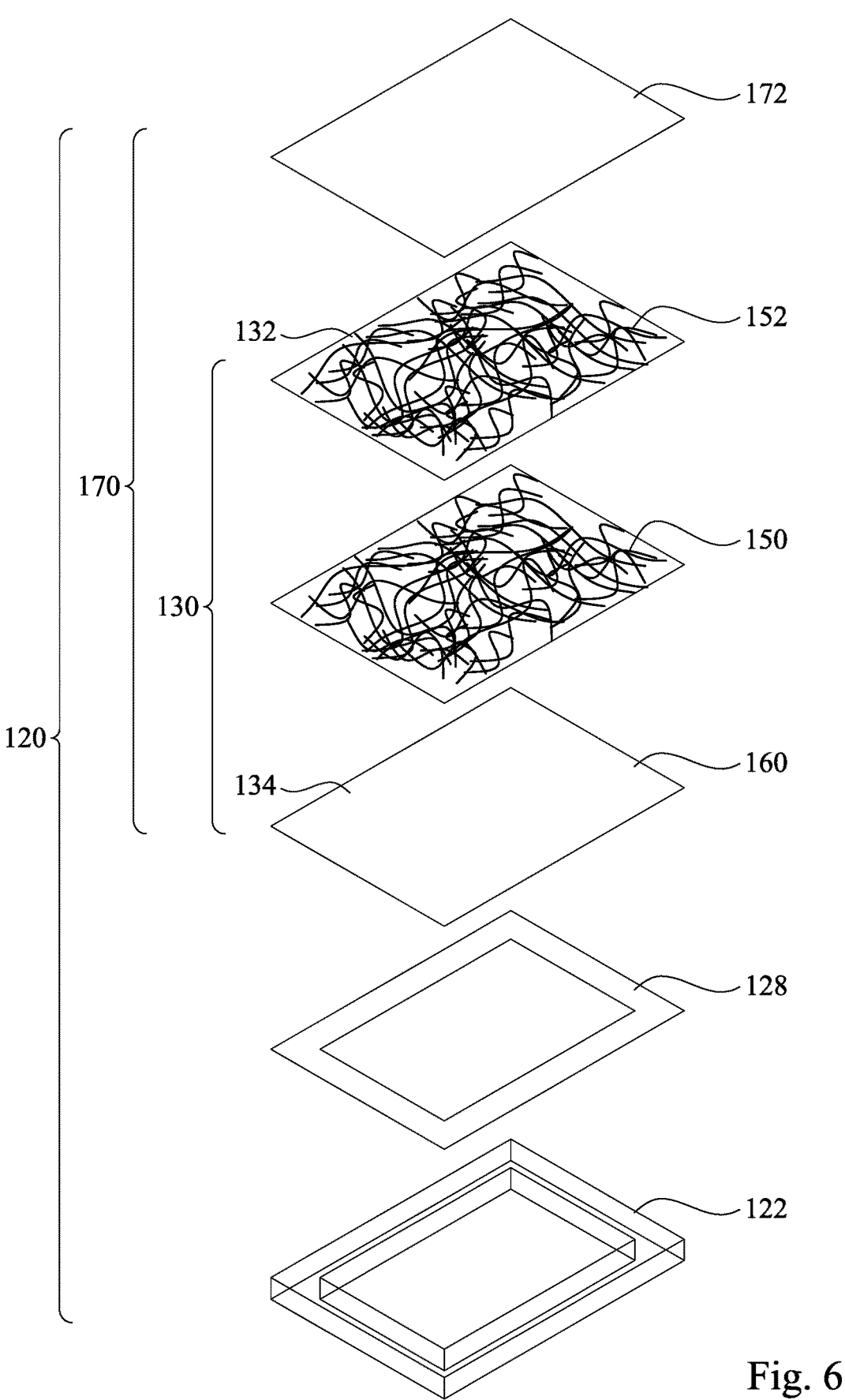
FIG. 6 is an exploded view of a fifth embodiment of a pellicle membrane, pellicle membrane assembly, and pellicle assembly in accordance with some embodiments.

FIG. 6 is an exploded view of a fifth embodiment of a pellicle membrane 130, pellicle membrane assembly 170, and pellicle assembly 120 according to the present disclosure. Here, in contrast to FIG. 4, the graphene membrane layer 160 forms the inner surface 134 of the pellicle membrane, and is attached to the border 128. The second nanotube membrane layer would be considered the outer surface 132 of the pellicle membrane. Both nanotube membrane layers 150, 152 are formed from randomly oriented nanotubes, and contact each other.

Figure 7:
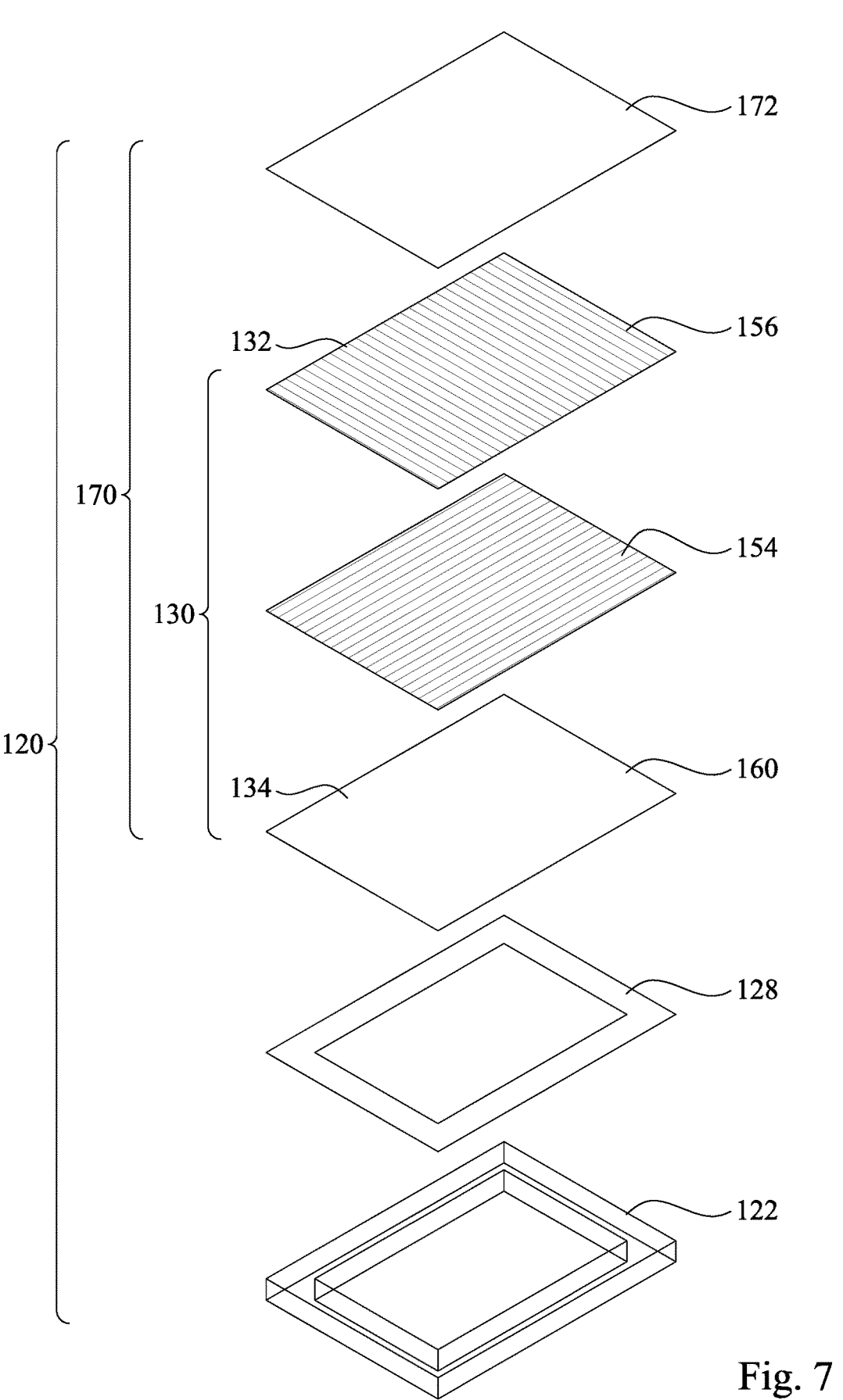
FIG. 7 is an exploded view of a sixth embodiment of a pellicle membrane, pellicle membrane assembly, and pellicle assembly in accordance with some embodiments.

FIG. 7 is an exploded view of a sixth embodiment of a pellicle membrane 130, pellicle membrane assembly 170, and pellicle assembly 120 according to the present disclosure. Here, in contrast to FIG. 6, both nanotube membrane layers 154, 156 are formed from directionally oriented nanotubes, and contact each other.

Figure 8:
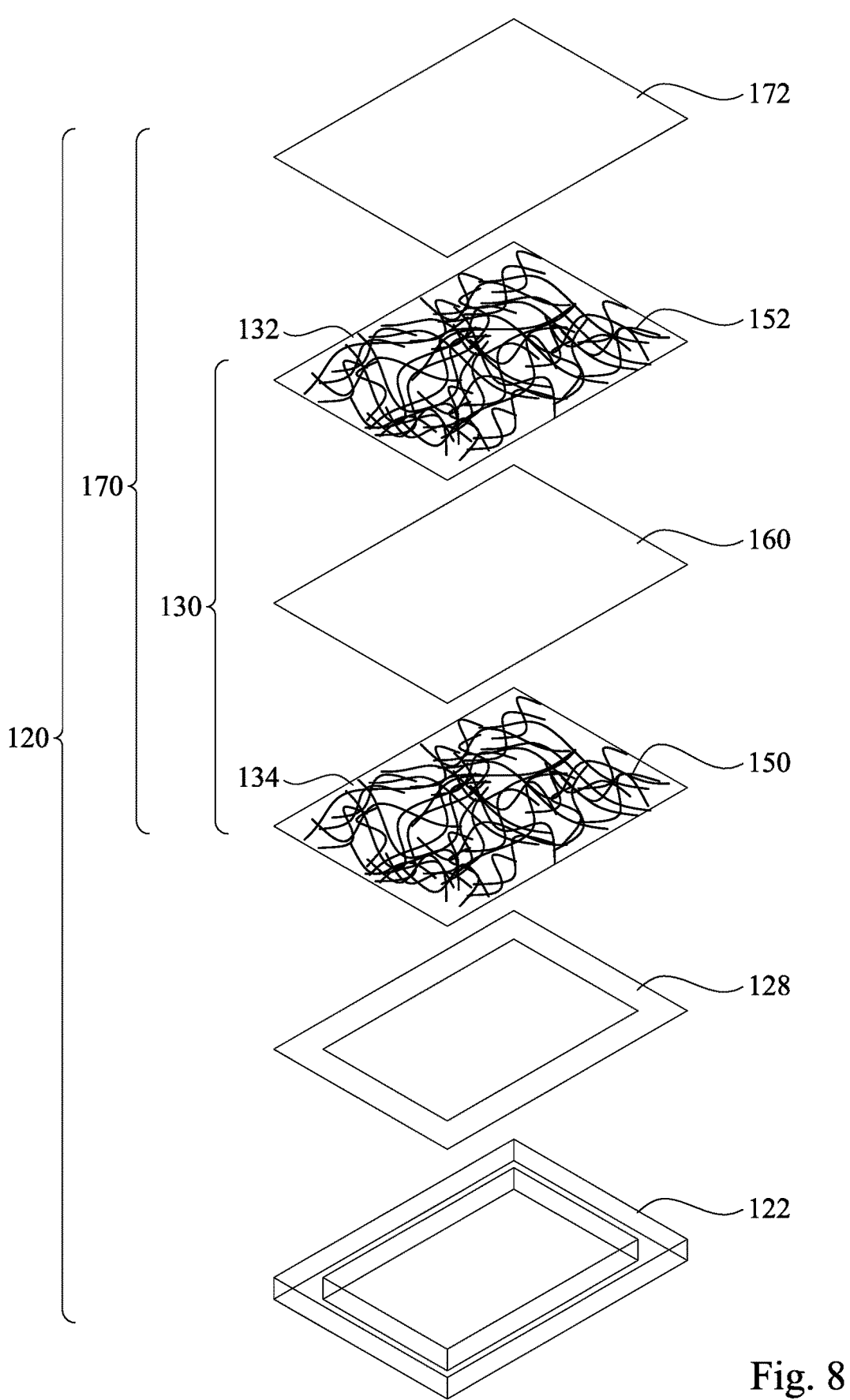
FIG. 8 is an exploded view of a seventh embodiment of a pellicle membrane, pellicle membrane assembly, and pellicle assembly in accordance with some embodiments.

FIG. 8 is an exploded view of a seventh embodiment of a pellicle membrane 130, pellicle membrane assembly 170, and pellicle assembly 120 according to the present disclosure. Here, the pellicle membrane is a multi-layer structure formed from a graphene membrane layer 160, a first nanotube membrane layer 150, and a second nanotube membrane layer 152. The graphene membrane layer 160 is located between the two nanotube membrane layers 150, 152. The first nanotube membrane layer is also considered the inner surface 134 of the pellicle membrane, and is attached to the border 128. The second nanotube membrane layer is considered the outer surface 132 of the pellicle membrane. The first nanotube membrane layer 150 and the second nanotube membrane layer 152 are formed from randomly oriented nanotubes.

Figure 9:
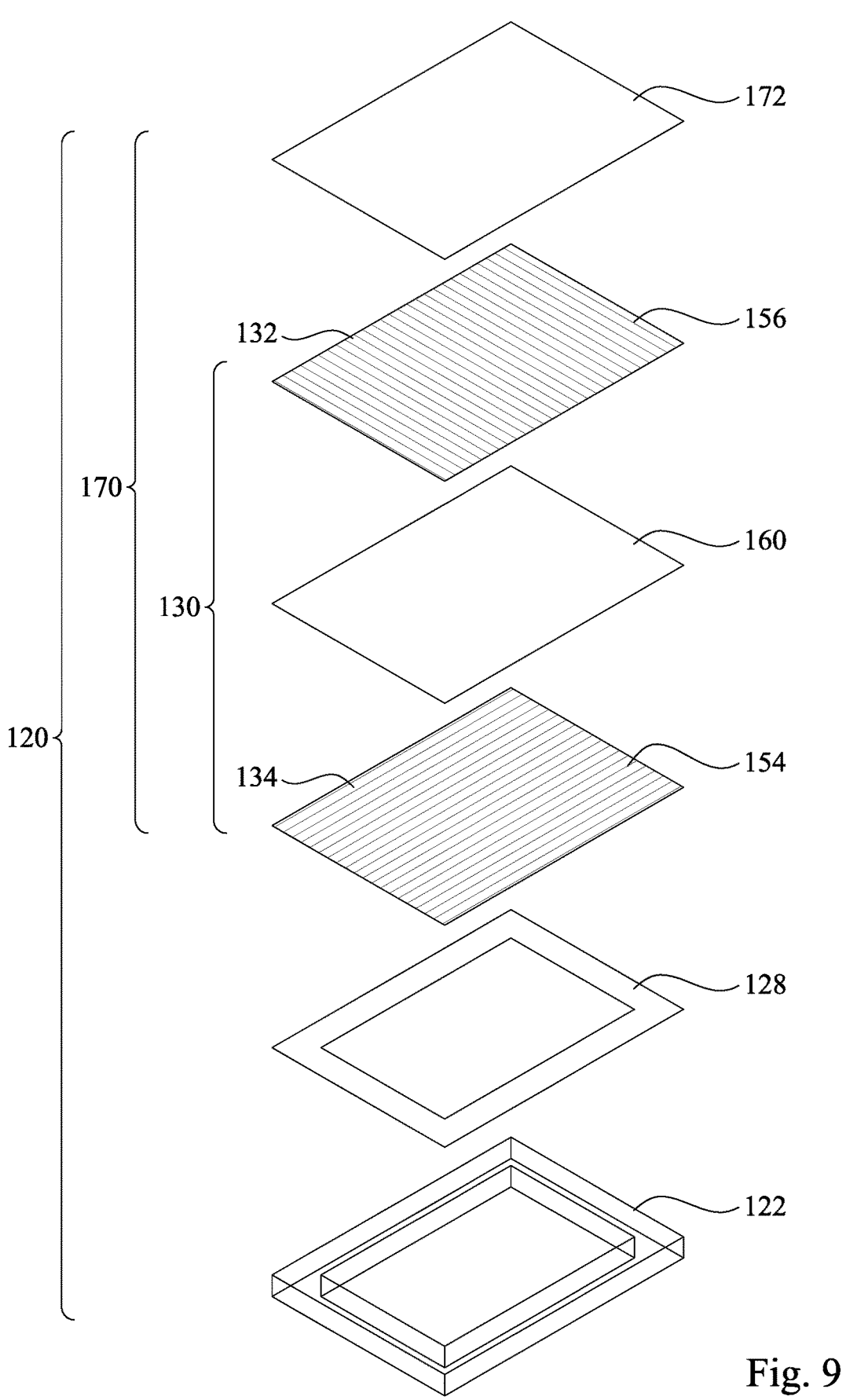
FIG. 9 is an exploded view of a eighth embodiment of a pellicle membrane, pellicle membrane assembly, and pellicle assembly in accordance with some embodiments.
Figure 10:
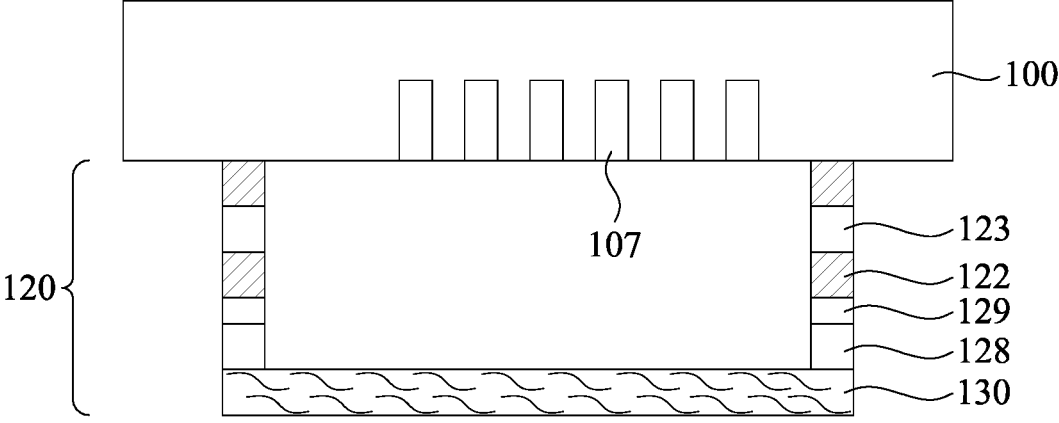
FIG. 10 is a side view of a pellicle assembly attached to an EUV reticle, in accordance with some embodiments.

FIG. 9 is an exploded view of an eighth embodiment of a pellicle membrane 130, pellicle membrane assembly 170, and pellicle assembly 120 according to the present disclosure. Here, in contrast to FIG. 8, both nanotube membrane layers 154, 156 are formed from directionally oriented nanotubes FIG. 10 is a side view of a pellicle assembly attached to an EUV reticle. As illustrated here, the EUV reticle 100 includes a patterned image 107. The pellicle assembly 120 includes the pellicle membrane 130 which is attached to border 128. The border 128 is jointed to the mounting frame 122 via adhesive layer 129, and protects the patterned image 107 from particle contaminants. As seen here, the mounting frame 122 can include vent holes 123.

FIGS. 11A-11C are different views of the mounting frame 122, according to some embodiments of the present disclosure. FIG. 11A is a plan cross-sectional view in which the plane cuts through the vent holes 123, FIG. 11B is a first side view, and FIG. 11C is a front side view. Vent holes 123 are visible on all sides of the mounting frame. However, it is contemplated that vent holes may be present on only one, two, or three sides of the mounting frame.

Both the border and the mounting frame can each be made from suitable materials such as anodized aluminum, stainless steel, plastic, silicon (Si), titanium, silicon dioxide, aluminum oxide ($Al_2O_3$), or titanium dioxide ($TiO_2$). As seen here, vent holes 123 may be present in the mounting frame 122 for equalizing pressure on both sides of the pellicle membrane. In some embodiments, the total area of the vent holes can range from zero to about 100 square millimeters ($mm^2$). It is noted that the pellicle membrane itself is relatively porous, and thus can provide the venting function itself. The vent holes can be spaced apart from each other as desired.

As described above, in some embodiments, one or more layers of the pellicle membrane are formed from nanotubes. In some embodiments, the nanotubes can be carbon nanotubes (CNTs) or boron nitride nanotubes (BNNTs) or silicon carbide nanotubes (SiCNTs). In some embodiments, the nanotubes can be single-wall nanotubes or multi-wall nanotubes. It is possible for multi-wall nanotubes to be made of different materials, for example a CNT inside a BNNT, or vice versa. In some embodiments, the nanotubes can be metallic or semiconducting or electrically insulating. The length and diameter of the individual nanotubes is not significant. The nanotubes can be made by known synthesis methods, such as arc discharge; laser vaporization of graphite; catalyzed chemical vapor deposition of hydrocarbons over a metal catalyst; ball milling and annealing of graphite powder; diffusion flame synthesis; electrolysis; low-temperature solid pyrolysis; floating catalyst CVD; or High Pressure Carbon Monoxide (HiPco) Process. Carbon nanotubes can have a Young's modulus of about 1.33 TPa; a maximum tensile strength of about 100 GPa; thermal conductivity of about 3000 to about 40,000 W/mK; and be stable up to a temperature of about 400° C. in air. Boron nitride nanotubes can have a Young's modulus of about 1.18 TPa; a maximum tensile strength of about 30 GPa; thermal conductivity of about 3000 W/mK; and be stable up to a temperature of about 800° C. in air.

Generally, the nanotubes of each nanotube membrane layer can be randomly oriented, or can be directionally oriented in a desired direction. The nanotube membrane layer(s), whether randomly oriented or directionally oriented, can be combined as desired. In some embodiments, the nanotube membrane layer(s) in the pellicle membrane are all randomly oriented. In some embodiments, the nanotube membrane layer(s) in the pellicle membrane are all directionally oriented. In these embodiments, the directionally oriented nanotube membrane layers are aligned at an angle relative to each other. That angle can be any angle between 0° and 180°, and for example may be 0°, 30°, 45°, 60°, 75°, 90°, 120°, 135°, 145°. 160°, or 180°.

In addition, in some embodiments, one or more layers of the pellicle membrane are formed from graphene or graphite. Such layers can provide more stiffness compared to layers formed from nanotubes. Graphite is made up of stacked graphene layers, and thus should be considered equivalent to graphene in this disclosure. In contrast to the nanotubes, graphene and graphite are in the shape of flat sheets or porous sheets. Graphene has a Young's modulus of approximately 1,000 GPa.

In some embodiments, the nanotube membrane layer(s), the graphene membrane layer(s), and the resulting pellicle membrane generally should not include any other materials. For example, the membranes should not contain any moisture or any other binders, metals, plastics, surfactants, acids, or other compounds that might have been present in precursor materials or used in prior processing steps. In some embodiments, each individual nanotube membrane layer can have a thickness ranging from about 10 nanometers (nm) to about 100 nm, although thicknesses outside this rang are also contemplated. In some embodiments, each individual graphene membrane layer can have a thickness ranging from about 1 nm to about 10 nm, although thicknesses outside this rang are also contemplated.

The nanotube membrane layer(s) and the graphene membrane layer(s) can be formed using several different fabrication processes. For example, such fabrication processes can include chemical vapor deposition (CVD) such as floating catalyst CVD or plasma-enhanced CVD; electrophoretic deposition; dispersal in a solution and concentration by removal of the solvent; vacuum filtration; and the like.

Figure 12:
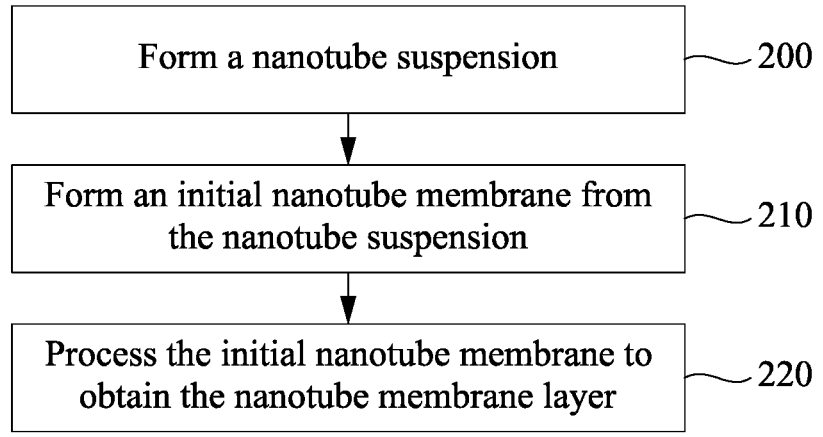
FIG. 12 is a flow chart illustrating a first method for preparing a nanotube membrane layer, in accordance with some embodiments.

FIG. 12 is a flow chart illustrating some embodiments of methods for preparing a nanotube membrane layer. In step 200, a suspension of nanotubes, such as carbon nanotubes or boron nitride nanotubes, is formed. The nanotubes may be suspended in water or some other suitable liquid. Other ingredients, such as surfactants, may also be present to disperse the nanotubes evenly. Ultrasonication may also be useful for even dispersion of the nanotubes. The nanotubes can then be filtered, treated, and/or cleaned as appropriate. For example, the surfactants can be removed through filtration after dispersion has been achieved. Mild acid, such as hydrochloric acid or nitric acid, may be used to remove particles such as amorphous carbon.

Next, in step 210, an initial nanotube membrane is formed by depositing the suspension on a surface and separating the liquid from the nanotubes. For example, as illustrated here, the suspension can be poured through filter paper, such as a polytetrafluoroethylene (PTFE) membrane having a pore size of about 0.02 micrometers (μm) to about 1.2 μm. Suction can be applied to the opposite side of the filter paper to obtain a uniform dispersion of the nanotubes on the filter paper.

Finally, in step 220, the initial nanotube membrane is processed to reduce its thickness and obtain the nanotube membrane layer. This can be done in multiple ways. In some embodiments, the thickness is decreased by applying compressive pressure (e.g. uniaxial compression) to the initial nanotube membrane, reducing the thickness of the initial nanotube membrane. In some embodiments, the compressive pressure applied is from about 0.1 bar to about 20 bar (about 0.01 MPa to about 2 MPa). In some embodiments, the compressive pressure is applied for a time period of about 1 minute to about 60 minutes. The degree of pressure can change during this time period. For example, the force can be increased gradually to a given force and then maintained at that force level.

In some other embodiments, the thickness is decreased by immersing the initial nanotube membrane in a solution, then running the solution through the initial nanotube membrane (for example by applying suction). It is noted that the resulting nanotube membrane layer is made from randomly oriented nanotubes.

Figures 13A, 13B:
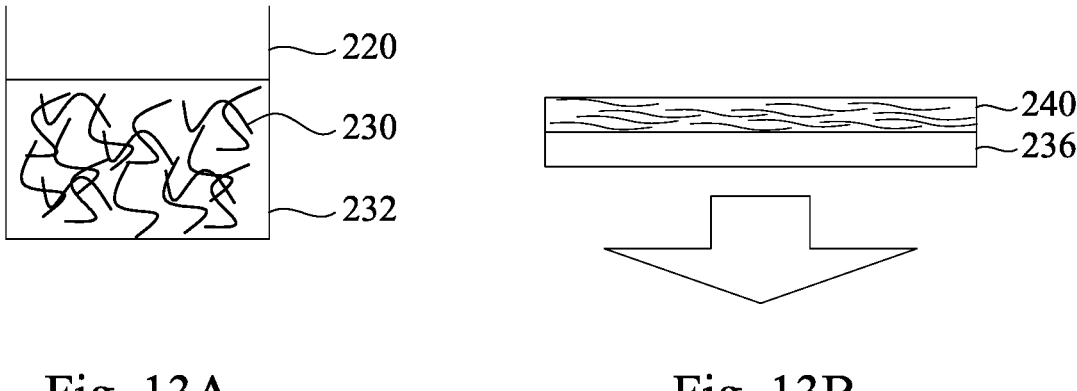
FIGS. 13A-13D are a set of diagrams illustrating the method of FIG. 12, in accordance with some embodiments.

FIGS. 13A-13D are a set of drawings illustrating the method of FIG. 12, in one embodiment. FIG. 13A illustrates a suspension of nanotubes. The nanotubes 230 are suspended in a liquid 232 within a vessel 234. In FIG. 13B, an initial nanotube membrane 240 is formed by depositing the suspension on a surface 236, such as filter paper.

Figure 13C:
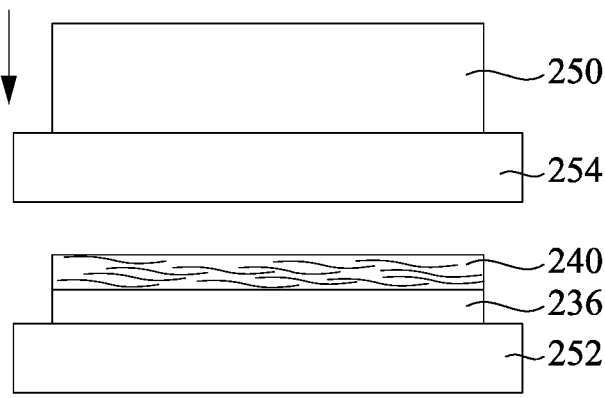

In FIG. 13C, a first method for processing the initial nanotube membrane to reduce its thickness and obtain the nanotube membrane layer is illustrated. Here, the initial nanotube membrane 240 and surface 236 are placed within a pressing machine 250, which comprises a bolster plate 252 and a ram 254. The initial nanotube membrane 240 is compressed between the bolster plate 252 and the ram 254 to obtain the nanotube membrane layer 260. The nanotube membrane layer also has a higher density than the initial membrane, and the nanotube membrane layer is thinner than the initial membrane (i.e. reduced thickness). Without being bound by theory, it is believed that the deformation of the nanotube membrane layer introduced by the uniaxial compression is maintained after the compressive force is removed by van der Waals forces. In other words, the nanotube membrane layer does not return to its original thickness after the compressive force is removed.

Figure 13D:
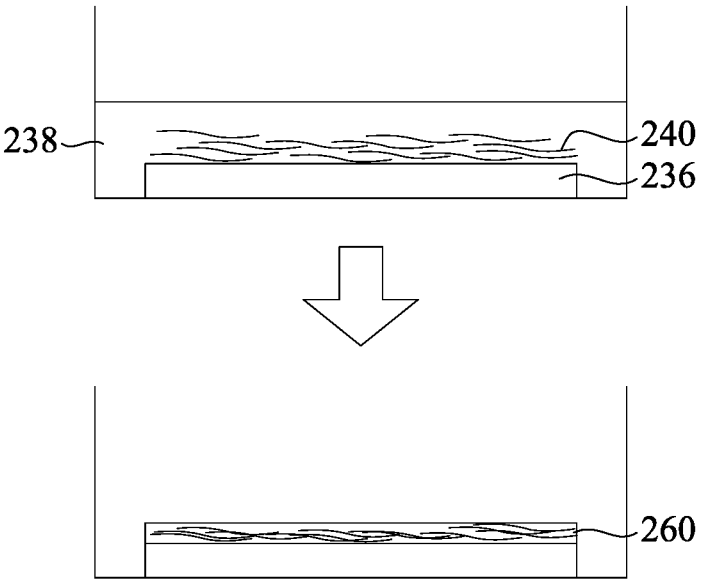

In FIG. 13D, a second method for processing the initial nanotube membrane to reduce its thickness and obtain the nanotube membrane layer is illustrated. Here, the initial nanotube membrane 240 and surface 236 are immersed in a solution 238. The solution is then run through the initial nanotube membrane to reduce its thickness. In some embodiments, the solvent in the solution is deionized water or an alcohol such as isopropyl alcohol (IPA). The resulting nanotube membrane layer 260 also has a higher density compared to the initial nanotube membrane.

Figure 14:
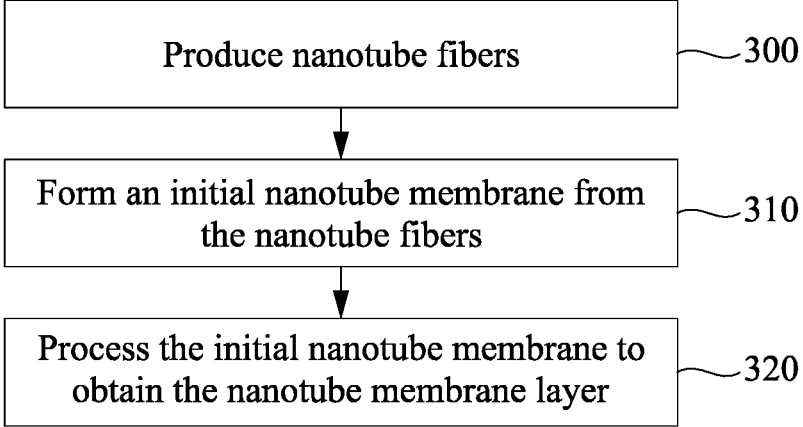
FIG. 14 is a flow chart illustrating a second method for preparing a nanotube membrane layer, in accordance with some embodiments.

FIG. 14 is a flow chart illustrating some additional embodiments of methods for preparing a nanotube membrane layer. In step 300, nanotube fibers, such as fibers made from carbon nanotubes or boron nitride nanotubes, are produced. Next, in step 310, an initial nanotube membrane is formed from the nanotube fibers. In some embodiments, this is done by arranging the fibers next to each other. Without being bound by theory, it is believed that the fibers are held together by van der Waals forces of sufficient strength to form the initial nanotube membrane. The initial nanotube membrane can be annealed. The annealing may occur at temperatures of about 1000° C. to about 2000° C. Finally, in step 320, the initial nanotube membrane is processed to reduce its thickness and obtain the nanotube membrane layer. This can be done as previously described, for example by compression or immersion in solution. It is noted that the resulting nanotube membrane layer is made from directionally oriented nanotubes.

Figure 15A:
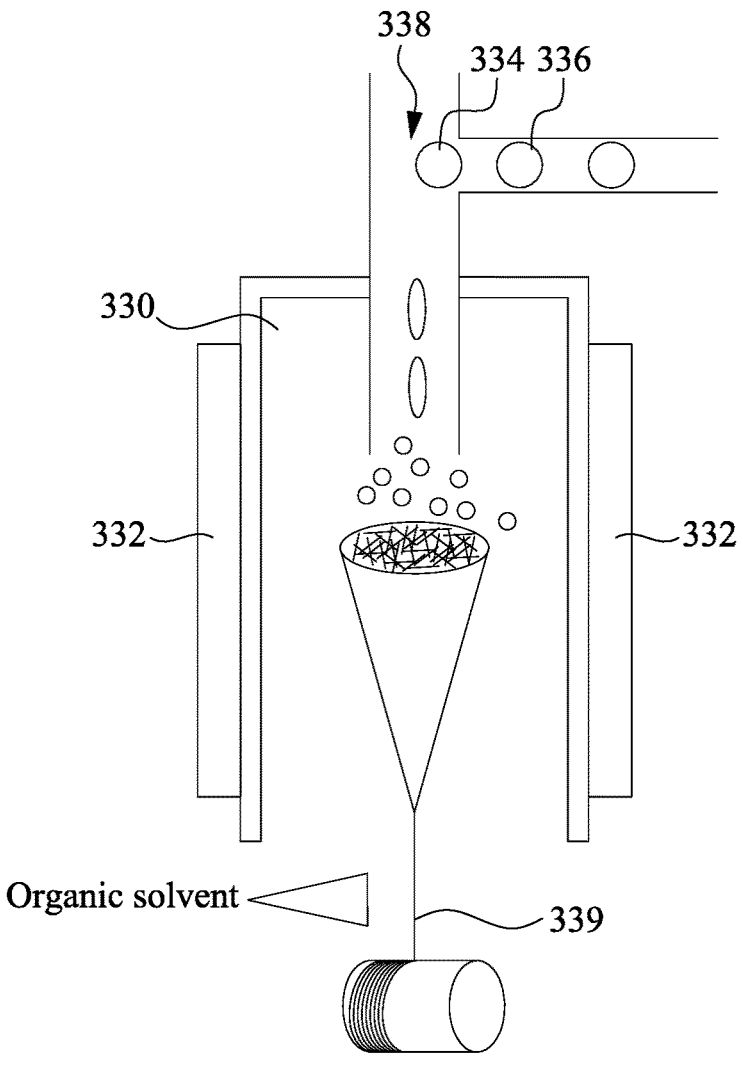
FIGS. 15A-15C are a set of diagrams illustrating the method of FIG. 14, in accordance with some embodiments.
Figure 15B:
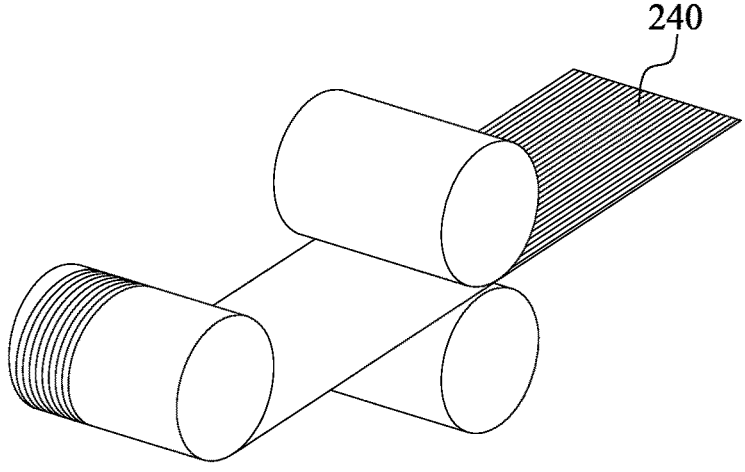
Figure 15C:
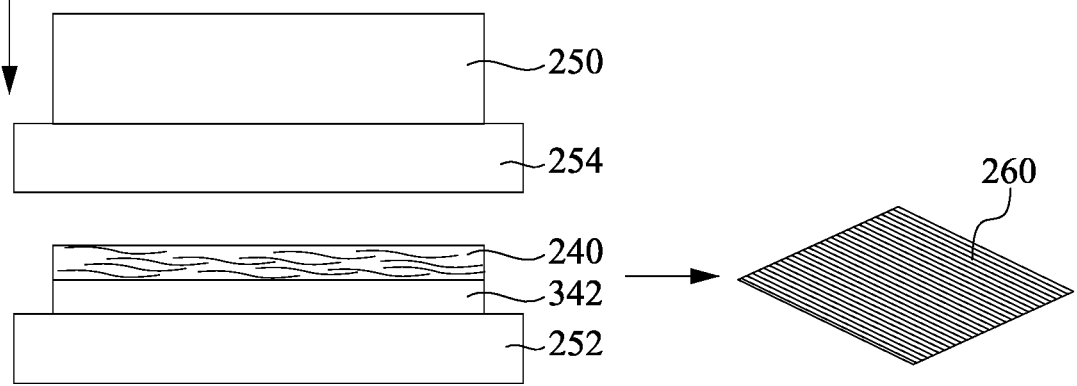

FIGS. 15A-15C are a set of drawings illustrating the method of FIG. 14, in one embodiment. FIG. 15A illustrates one embodiment of an apparatus that can be used to produce nanotube fibers using floating catalyst CVD. A reaction vessel 330 is illustrated, with a heat source 332 for heating materials passing through the reaction vessel. Reactants 334, catalyst 336, and carrier gas 338 enter the reaction vessel.

Nucleation, growth, and aggregation of nanotubes in the form of an aerogel occur, and the aerogel is then spun into fibers 339. In some embodiments, this process occurs at temperatures of about 1100° C. to about 1300° C. This results in the nanotubes being directionally oriented (i.e., oriented in the same direction). An organic solvent is used for densification of the fibers. In some embodiments, the organic solvent can be acetone or an alcohol such as isopropyl alcohol. In FIG. 15B, an initial nanotube membrane 240 is formed from the nanotube fibers. This can be done, for example, as described above. The carbon nanotubes in the initial nanotube membrane are directionally oriented. In FIG. 15C, the initial nanotube membrane is processed to reduce its thickness and obtain the nanotube membrane layer. As illustrated here, the initial nanotube membrane 240 is supported by a surface 342, which is placed within a pressing machine 250, which comprises a bolster plate 252 and a ram 254. The initial nanotube membrane 240 is compressed between the bolster plate 252 and the ram 254 to obtain the nanotube membrane layer 260.

Figure 16:
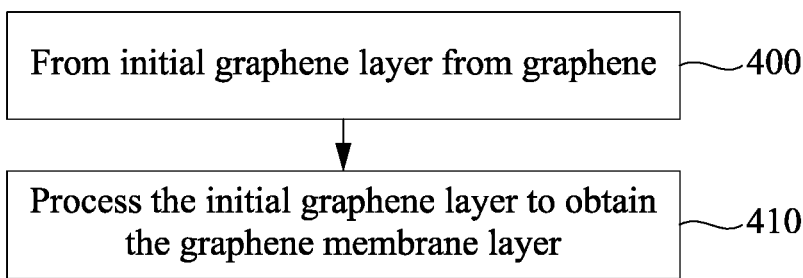
FIG. 16 is a flow chart illustrating a method for preparing a graphene membrane layer, in accordance with some embodiments.

FIG. 16 is a flow chart illustrating one embodiment of a method for preparing a graphene membrane layer. In step 400, an initial graphene layer is formed by dispersing relatively small graphene flakes or sheets on a surface to obtain a relatively large initial membrane. The smaller flakes or sheets can be arranged so that pores of a desired size are present between the smaller flakes/sheets. It is noted that this initial membrane can fall apart easily, since the individual flakes/sheets are not strongly bound to each other. Finally, in step 410, the initial graphene layer is processed to reduce its thickness and obtain the graphene membrane layer. In some embodiments, the thickness is reduced by applying compressive pressure (e.g. uniaxial compression) to the initial graphene layer, reducing the volume of the initial graphene layer. The resulting graphene membrane layer can then be affixed to the border or another membrane layer.

Figure 17A:
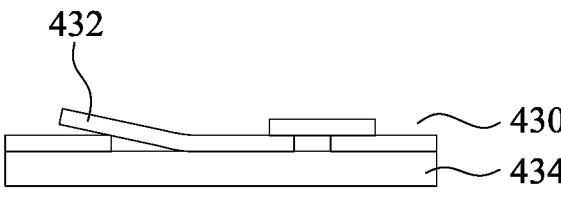
FIGS. 17A-17B are a set of diagrams illustrating the method of FIG. 16, in accordance with some embodiments.
Figure 17B:
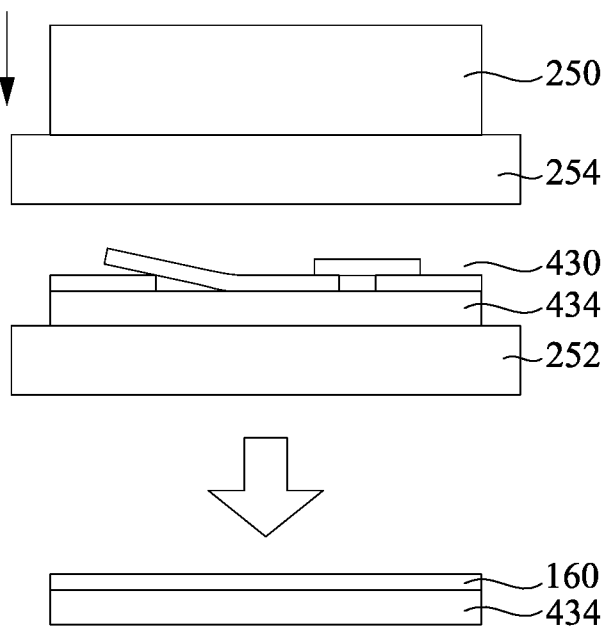

FIG. 17A and FIG. 17B are a set of drawings illustrating the method of FIG. 16, in one embodiment. In FIG. 17A, an initial graphene layer 430 is formed by dispersing graphene flakes or sheets 432 on a surface 434. As illustrated in FIG. 17B, the graphene membrane layer 160 is prepared by compressing the initial graphene layer 430 between the bolster plate 252 and the ram 254 of a pressing machine 250.

In some embodiments, each initial nanotube or graphene membrane prior to processing has a thickness of at least 0.7 micron (700 nm), and the processing operates to reduce the thickness to produce an individual nanotube or graphene membrane layer having a thickness of 200 nm or less. In some embodiments, the initial membrane(s) may each have a thickness ranging from about 1 micrometer (μm) to about 10 μm. In some embodiments, the resulting nanotube or graphene membrane layer has a thickness of from about 10 nanometers (nm) to about 100 nm. At higher thicknesses, mechanical properties may change in undesirable ways.

After the membrane layer(s) for the pellicle membrane is/are made, the membrane layer(s) is/are then joined together to form the pellicle membrane. In some embodiments, the final pellicle membrane, which may be made up of one or more membrane layers, should have a thickness of from about 10 nanometers (nm) to about 100 nm.

FIG. 18 is a flow chart illustrating one embodiment of a method for preparing a multi-layer structure for a pellicle membrane. Very generally, in step 500, a border is placed adjacent to a surface of a first membrane layer. Next, in step 510, pressure is applied to affix the first membrane layer to the border. The first membrane layer and the border remain attached via Van der Waals forces. If it is desired to make the pellicle membrane from more than one layer, then in step 520, the border and any already-attached membrane layer(s) are laid upon a surface of the additional membrane layer. The outermost already-attached membrane layer contacts the surface of the additional membrane layer. Next, in step 530, pressure is applied again to affix the additional membrane layer to the already-attached membrane layer(s). Steps 520 and 530 can be repeated with additional membrane layers until the desired multi-layer structure of the pellicle membrane is assembled. In step 535, the conformal coating is applied to the pellicle membrane.

Figure 19A:
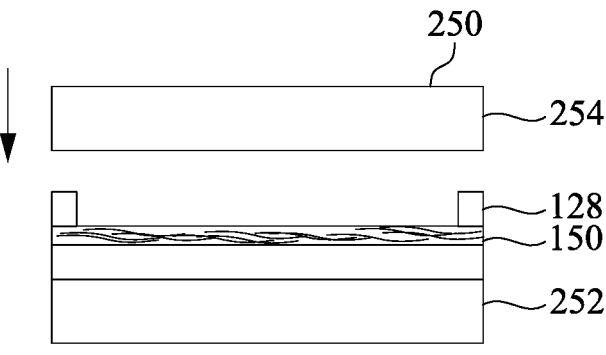
FIGS. 19A-19C are a set of diagrams illustrating the method of FIG. 18, in accordance with some embodiments.
Figure 19B:
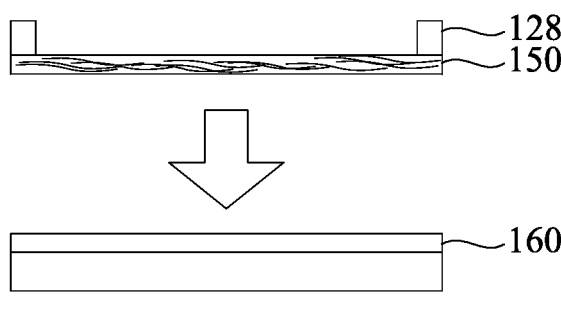
Figure 19C:
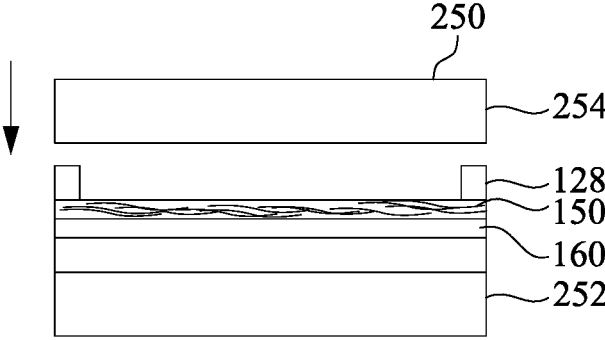

FIGS. 19A-19C are a set of drawings illustrating the method of FIG. 18, in one embodiment. In FIG. 19A, a first nanotube membrane layer 150 is affixed to the border 128 through pressure applied by a pressing machine 250 comprising a bolster plate 252 and a ram 254. In FIG. 19B, the border 128 and first nanotube membrane layer 150 (already attached to the border 128) are then laid upon a graphene membrane layer 160. In FIG. 19C, pressure is again applied through the pressing machine 250 to attach the graphene membrane layer 160 to the first nanotube membrane layer 150. A multi-layer pellicle membrane can thus be built up successively. It is noted that the thickness of the multi-layer pellicle membrane might vary slightly between the center of the pellicle membrane and the edges of the pellicle membrane where pressure has been used to attach the layers to the border.

Figure 20:
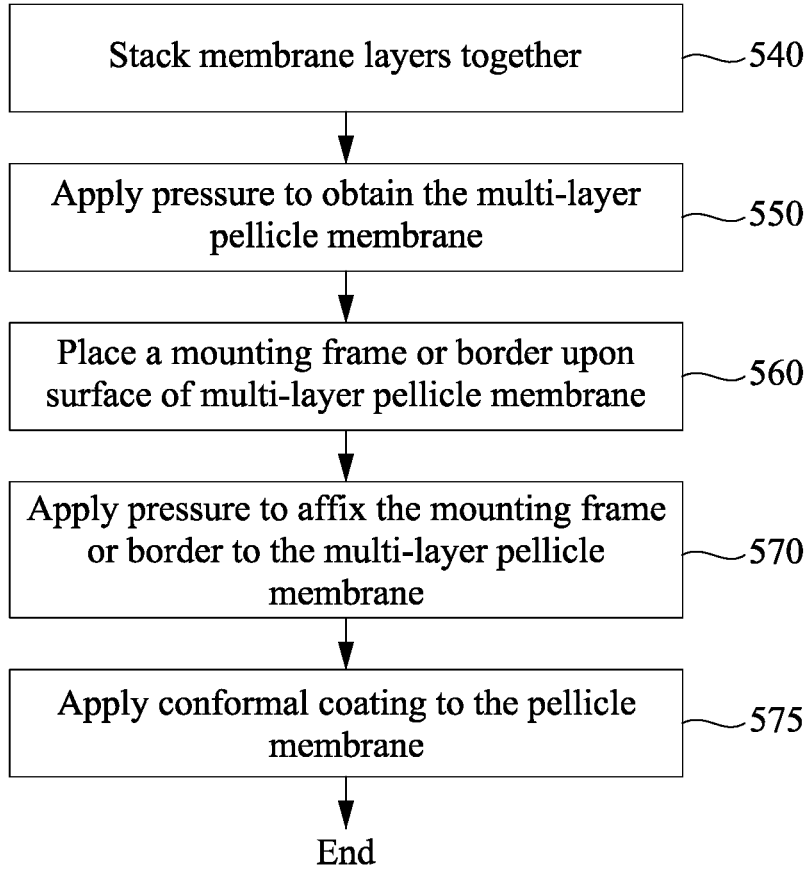
FIG. 20 is a flow chart illustrating another method for preparing a multi-layer structure for a pellicle membrane, in accordance with some embodiments.

FIG. 20 is a flow chart illustrating another embodiment of a method for preparing a multi-layer structure for a pellicle membrane. Very generally, in step 540, the individual layers are stacked upon each other in their desired order. Next, in step 550, pressure is applied to reduce the thickness and join the individual layers together to obtain the multi-layered pellicle membrane. Two or more individual layers can be joined together in this single compression step. Next, in step 560, a mounting frame or border is placed adjacent to a surface of the pellicle membrane. Then, in step 570, pressure is applied to affix the pellicle membrane to the mounting frame or border. In step 575, the conformal coating is applied to the pellicle membrane.

Figure 21A:
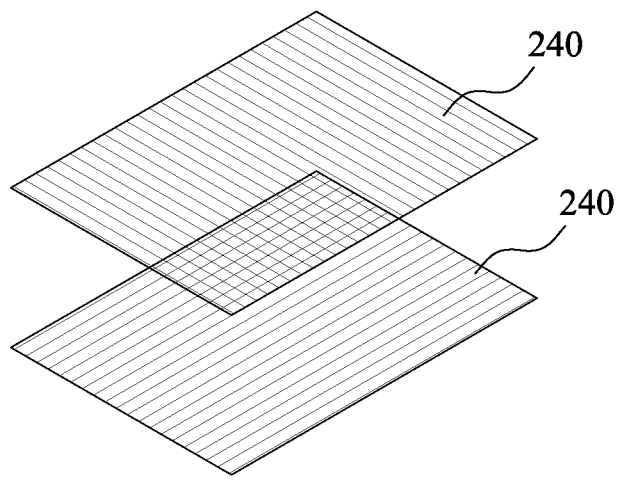
FIGS. 21A-21C are a set of diagrams illustrating the method of FIG. 20, in accordance with some embodiments.
Figure 21B:
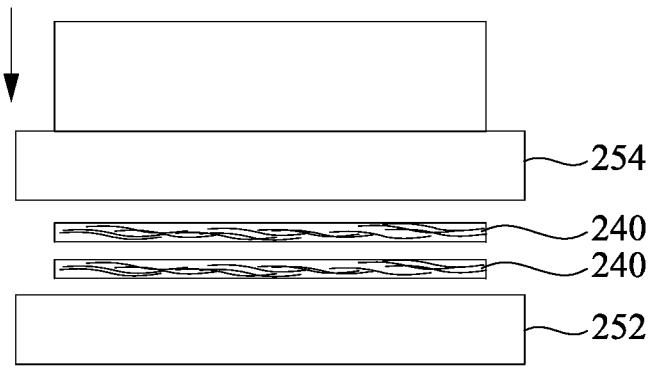
Figure 21C:
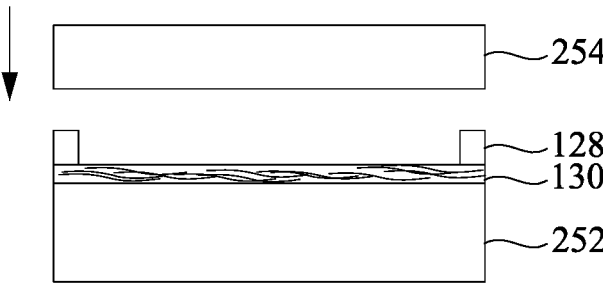

FIGS. 21A-21C are a set of drawings illustrating the method of FIG. 20, in one embodiment. In FIG. 21A, two directionally oriented initial nanotube membranes 240 are illustrated. They can be placed at any angle relative to each other, ranging from 0° to 100° and any range in between, although the relative angle is not critical. In FIG. 21B, the two initial nanotube membranes 240 are concurrently compressed between the bolster plate 252 and the ram 254, resulting in the multi-layer pellicle membrane 130. In FIG. 21C, the border 128 is laid upon the pellicle membrane 130, and compressive pressure is applied to join them together.

Figure 22A:
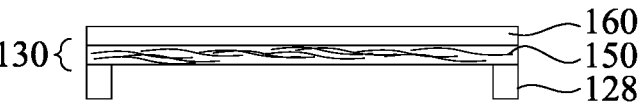
FIGS. 22A-22D are a set of diagrams illustrating a method for coating an outer surface of a pellicle membrane, in accordance with some embodiments.
Figure 22B:
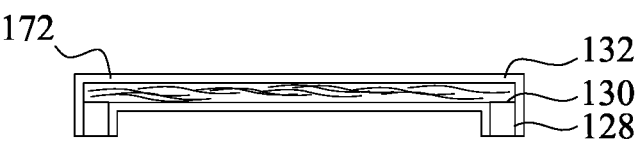
Figure 22C:
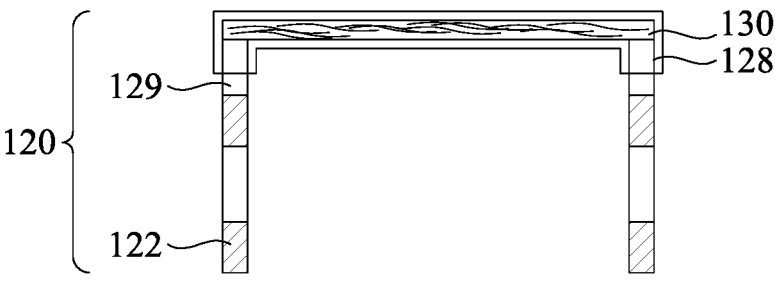
Figure 22D:
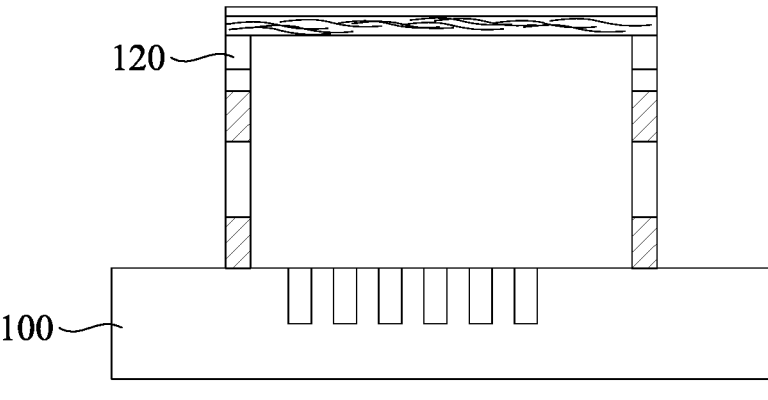

Once the pellicle membrane has been attached to the border, a conformal coating is applied to the outer surface of the pellicle membrane. This is illustrated in FIGS. 22A-22D, in one embodiment. FIG. 22A shows the assembly of the border 128 and the pellicle membrane 130, which is comprised of a nanotube membrane layer 150 and a graphene membrane layer 160. The border is directly attached to the nanotube membrane layer 150, which acts as the inner surface 134 of the pellicle membrane 130. The graphene membrane layer 160 acts as the outer surface 132 of the pellicle membrane 130. As seen in FIG. 22B, a coating is applied to the outer surface 132 of the pellicle membrane 130 to form the outermost layer 172. It is noted that the coating is illustrated as also being applied to the sides of the pellicle membrane, and the coating can also end up on the border 128 due to the application process. In FIG. 22C, the coated pellicle membrane 130 and border 128 are then attached to a mounting frame 122, for example through adhesive layer 129, to form a pellicle assembly 120. In FIG. 22D, the pellicle assembly 120 is mounted to the reticle 100 (having the desired mask pattern) by securing the frame to the reticle, with the pellicle membrane disposed over the mask pattern, to produce a final reticle assembly, such as that shown in FIG. 1 by way of non-limiting illustrative example.

The conformal coating can be applied by conventional methods known in the art, such as spraying, dip coating, etc. It is desired that the conformal coating conforms to the exposed surfaces of the pellicle membrane, so that the pores which are present in the pellicle membrane remain present and are not filled by the conformal coating. Such exposed surfaces may be present in any or all of the different layers of a multi-layer pellicle membrane. In addition, the conformal coating will penetrate into the pellicle membrane, rather than being a single discrete layer upon the pellicle membrane. For example, when the conformal coating is applied to the pellicle membrane illustrated in FIG. 4 as having a graphene membrane layer 160 and two nanotube membrane layers 150, 152, it is expected that the sides of some nanotubes of the two nanotube membrane layers may also be covered with the conformal coating.

The conformal coating is intended to protect the pellicle membrane from damage that can occur due to heat and hydrogen plasma created during EUV exposure. Generally, the material used for the coating should have a low refractive index, i.e. should be as close to 1 as possible when measured at a wavelength of 13.5 nm. The material used for the coating should also have a low extinction coefficient at a wavelength of 13.5 nm. The extinction coefficient measures how easily the material can be penetrated by the wavelength. Desirably, the material used for the conformal coating has a transmittance (T %), when measured at an EUV wavelength of 13.5 nm, of greater than 90%, or of greater than 92%, or of greater than 94%, or of greater than 95%, when measured at a thickness of between 1 nanometer and 10 nanometers. This reduces EUV absorption by the conformal coating (permitting further downstream processing) while protecting the pellicle membrane.

In some embodiments, the coating comprises B, BN, $B_4C$, $B_2O_3$, SiN, $Si_3N_4$, $SiN_2$, SiC, $SiC_xN_y$, Nb, NbN, NbSi, NbSiN, $Nb_2O_5$, $NbTi_xN_y$, $ZrN_x$, $ZrY_xO_y$, $ZrF_4$, YN, $Y_2O_3$, YF, Mo, $Mo_2N$, MoSi, MoSiN, Ru, RuNb, RuSiN, TiN, $TiC_xN_y$, $HfO_2$, $HfN_x$, $HfF_4$, or VN. In some embodiments, the outermost layer has a thickness of about 1 nanometer (nm) to about 10 nm. This thickness should be measured as the thickness of the coating on the individual components of each layer in the pellicle membrane, for example the thickness of the coating on a carbon nanotube. The coating may penetrate deeper into the pellicle membrane than this thickness.

Referring now to FIGS. 11A-11C and FIG. 20B together, it is noted that one significant distinction between the border 128 and the mounting frame 122 is that the mounting frame 122 includes vent holes 123. These vent holes typically have very small diameters, which can be easily filled or plugged by the coating process illustrated in FIG. 20B. The use of a border 128 is more convenient for applying the conformal coating to the pellicle membrane, while also protecting the vent holes of the mounting frame. If desired, the use of the border can be omitted, with the pellicle membrane being attached directly to a mounting frame of suitable structure. For example, in some embodiments of such mounting frames, vent holes are present at the end of the mounting frame opposite the end to which the pellicle membrane is attached. Referring to FIG. 10, such a mounting frame could be envisioned as the combination of separate components 122, 129, and 128.

Because the pellicle membrane is in the optical path between the reticle and the wafer upon which the transferred pattern is to be imaged, certain optical properties are desired for the pellicle membrane. For example, the pellicle membrane should have high transmittance (i.e. optically transparent) for EUV wavelengths, low reflectivity for EUV wavelengths, low non-uniformity, and low scattering. During exposure and regular operations, the pellicle membrane will be exposed to high temperatures, and so certain thermal properties are also desirable. For example, the pellicle membrane should have low thermal expansion, high thermal conductivity, and high thermal emissivity. The pellicle membrane should also have good mechanical properties, such as high stiffness (i.e. low sagging or deflection) and stability. The pellicle membranes of the present disclosure have combinations of these desired properties.

The methods described herein provide a pellicle membrane with an improved combination of EUV transmittance, pore size, stiffness, and service lifetime. The pellicle membranes of the present disclosure maintain high transmittance in the EUV wavelength range. This permits more light to reach the photomask for a given exposure energy and also reduces heat buildup in the pellicle membrane. In some embodiments, the pellicle membranes have a transmittance (T %), when measured at an EUV wavelength of 13.5 nm, of greater than 90%, or of greater than 95%, or of greater than 96%, or of greater than 97%.

One means by which the high transmittance is obtained is through the presence of pores in the pellicle membrane, since the pores do not reflect or absorb EUV wavelengths. The pellicle membranes of the present disclosure have an average pore size that is small enough to prevent particles from passing through the pellicle membrane and landing on the reticle/photomask. In some embodiments, the maximum pore size of the pores in the pellicle membranes is less than 30 nm in diameter (after the conformal coating has been applied). In this regard, a pore is considered to be any straight path that passes entirely through the pellicle membrane. Pores may be present due to spaces between nanotubes, or between the flakes/sheets of graphene or graphite. The pore size is the smallest diameter of this straight path (because a particle only has to be trapped before passing through the pellicle membrane, it does not have to be stopped at the outer surface of the pellicle membrane). In a multi-layer pellicle membrane, the pore size of the pellicle membrane is usually much smaller, because the pores of a given membrane layer do not align with the pores of another membrane layer. The pore size can be measured using conventional methods, for example by imaging the membrane and measuring the size of each pore.

The increased stiffness of the pellicle membrane minimizes any potential sagging or deflection that may occur over time. For example, the dimensions of the pellicle membrane (length and width) are on the order of ~100 millimeters. The pellicle membranes of the present disclosure may sag or deflect in the range of 700 micrometers or less under an applied pressure differential of two pascals (Pa). In embodiments, the pellicle membrane may have a thickness ranging from about 10 nanometers (nm) to about 100 nm.

The pellicle membranes of the present disclosure also have low reflectivity for EUV wavelengths. Again, this permits more light to reach the photomask for a given exposure energy and also reduces critical dimension (CD)

error. In some embodiments, the pellicle membranes have a reflectivity (R %), when measured at an EUV wavelength of 13.5 nm, of 5% or less, or of 3% or less, or of 2% or less, or of 1% or less, or of 0.5% or less.

The pellicle membranes of the present disclosure also have low non-uniformity at EUV wavelengths, or in other words have high uniformity. This reduces local CD error that can otherwise occur. In some embodiments, the pellicle membranes have a non-uniformity (U %), when measured at an EUV wavelength of 13.5 nm, of 1% or less, or of 0.5% or less, or of 0.3% or less, or of 0.1% or less.

Some embodiments of the present disclosure thus describe a pellicle membrane assembly which comprises (A) a pellicle membrane having an outer surface and an inner surface; and (B) a conformal coating on at least the outer surface of the membrane.

Other embodiments of the present disclosure describe a reticle assembly comprising a reticle and a pellicle assembly, and a method for producing such a reticle assembly. The reticle has a mask pattern thereon. The pellicle assembly is disposed over the mask pattern and mounted/secured to the reticle. The pellicle assembly comprises a multi-layer pellicle membrane having a conformal coating on an outer surface thereof.

Other embodiments of the present disclosure relate to methods for increasing the service lifetime of a pellicle membrane. A conformal coating is applied to at least an outer surface of the pellicle membrane. The conformal coating has a transmittance (T %), when measured at an EUV wavelength of 13.5 nm and at a thickness of between 1 nm and 10 nm, of greater than 90%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle assembly, comprising:
   a multi-layer pellicle membrane having an outer surface and an inner surface, wherein the multi-layer pellicle membrane comprises at least a first nanotube membrane layer, a second nanotube membrane layer, and a graphene membrane layer; and
   a conformal coating that conforms to exposed surfaces in all layers of the multi-layer pellicle-membrane, wherein the conformal coating comprises $ZrF_4$, YF, or $HfF_4$.

2. The pellicle assembly of claim 1, wherein the first nanotube membrane layer and the second nanotube membrane layer each have a thickness of about 10 nm to about 100 nm.

3. The pellicle assembly of claim 1, wherein the second nanotube membrane layer comprises randomly oriented nanotubes or directionally oriented nanotubes.

4. The pellicle assembly of claim 1, wherein the conformal coating has a thickness of about 1 nanometer to about 10 nanometers.

5. The pellicle assembly of claim 1, further comprising a mounting frame attached to a border which contacts the inner surface of the pellicle membrane.

6. The pellicle assembly of claim 5, wherein the mounting frame includes vent holes and the border does not include vent holes.

7. The pellicle assembly of claim 1, wherein the pellicle membrane has an EUV transmittance at 13.5 nm of at least 90%, a maximum deflection of 700 μm, and a maximum pore size of 30 nanometers.

8. A method for producing a reticle assembly comprising:

mounting a pellicle assembly over a mask pattern on a reticle;

wherein the pellicle assembly comprises a multi-layer pellicle membrane having a conformal coating, wherein the multi-layer pellicle membrane comprises at least a first nanotube membrane layer, a second nanotube membrane layer, and a graphene membrane layer, wherein the conformal coating conforms to exposed surfaces in all layers of the multi-layer pellicle membrane, and wherein the conformal coating comprises $ZrF_4$, YF, or $HfF_4$.

9. The method of claim 8, wherein the pellicle membrane has an EUV transmittance at 13.5 nm of at least 90%, a maximum deflection of 700 μm, and a maximum pore size of 30 nanometers.

10. A method for increasing service lifetime of a pellicle membrane, comprising:

applying a conformal coating to a multi-layer pellicle membrane by spraying or coating, wherein the multi-layer pellicle membrane comprises at least a first nanotube membrane layer, a second nanotube membrane layer, and a graphene membrane layer that forms an outer surface of the pellicle membrane, wherein the graphene membrane layer is a continuous film without pores and wherein the conformal coating conforms to exposed surfaces in all layers of the multi-layer pellicle membrane;

wherein the conformal coating comprises $ZrF_4$, YF, or $HfF_4$; and wherein the conformal coating has a transmittance (T %), when measured at an EUV wavelength of 13.5 nm and at a thickness of between 1 nm and 10 nm, of greater than 90%.

11. The pellicle assembly of claim 1, wherein the first nanotube membrane layer comprises randomly oriented nanotubes or directionally oriented nanotubes.

12. The method of claim 10, wherein the first nanotube membrane layer and the second nanotube membrane layer each have a thickness of about 10 nm to about 100 nm.

13. The method of claim 10, wherein the conformal coating has a thickness of about 1 nanometer to about 10 nanometers.

14. The method of claim 10, wherein the nanotubes in the first nanotube membrane layer and the second nanotube membrane layer are boron nitride nanotubes or silicon carbide nanotubes.

15. The method of claim 10, wherein the nanotubes in the first nanotube membrane layer and the second nanotube membrane layer are multi-wall nanotubes made of different materials.

16. The method of claim 8, wherein the pellicle assembly further comprises a border or a mounting frame contacting the inner surface of the pellicle membrane.

17. The method of claim 8, wherein the first nanotube membrane layer and the second nanotube membrane layer each have a thickness of about 10 nm to about 100 nm.

18. The method of claim 8, wherein the first nanotube membrane layer and the second nanotube membrane layer each comprise randomly oriented nanotubes or directionally oriented nanotubes.

19. The method of claim 8, wherein the conformal coating has a thickness of about 1 nanometer to about 10 nanometers.

20. The method of claim 8, wherein the nanotubes in the first nanotube membrane layer and the second nanotube membrane layer are boron nitride nanotubes or silicon carbide nanotubes.

\* \* \* \* \*